United States Patent
Islam et al.

(10) Patent No.: US 10,219,389 B2
(45) Date of Patent: Feb. 26, 2019

(54) ELECTRONIC DEVICE HAVING MILLIMETER WAVE ANTENNAS

(71) Applicant: MOTOROLA MOBILITY LLC, Chicago, IL (US)

(72) Inventors: Md Rashidul Islam, Lombard, IL (US); Eric Krenz, Crystal Lake, IL (US); Hugh Smith, Palatine, IL (US); Istvan Szini, Grayslake, IL (US)

(73) Assignee: Motorola Mobility LLC, Chicago, IL (US)

( * ) Notice: Subject to any disclaimer, the term of this patent is extended or adjusted under 35 U.S.C. 154(b) by 234 days.

(21) Appl. No.: 15/442,974

(22) Filed: Feb. 27, 2017

(65) Prior Publication Data

US 2018/0248254 A1   Aug. 30, 2018

(51) Int. Cl.
*H01Q 1/24* (2006.01)
*H05K 3/30* (2006.01)
(Continued)

(52) U.S. Cl.
CPC ............ *H05K 3/30* (2013.01); *G06F 1/1684* (2013.01); *H01Q 1/243* (2013.01); *H01Q 19/06* (2013.01); *H01Q 19/102* (2013.01); *H01Q 19/13* (2013.01); *H01Q 19/32* (2013.01); *H01Q 21/08* (2013.01); *H05K 1/0243* (2013.01); *H05K 1/18* (2013.01); *H05K 3/4038* (2013.01); *H01Q 9/30* (2013.01); *H01Q 21/205* (2013.01)

(58) Field of Classification Search
CPC ........ H01Q 1/243; H01Q 19/06; H01Q 21/08; H01Q 19/13; H05K 3/30; H05K 1/18

USPC .......................................................... 343/702
See application file for complete search history.

(56) References Cited

U.S. PATENT DOCUMENTS

| 6,512,494 B1 * | 1/2003 | Diaz | ........................ H01Q 7/00 343/842 |
| 6,670,932 B1 * | 12/2003 | Diaz | ........................ H01Q 7/00 343/700 MS |

(Continued)

OTHER PUBLICATIONS

Yoon, Y., et al., A Vertical W-band Surface-Micromachined Yagi-Uda Antenna, IEEE Antennas and Propagation Society International Symposium, vol. 4B, (Jul. 2005).
(Continued)

*Primary Examiner* — Huedung X Mancuso
(74) *Attorney, Agent, or Firm* — Yudell Isidore PLLC

(57) ABSTRACT

An antenna assembly is formed in a multilayer printed circuit board (PCB) for transceiving in a millimeter wave (mmWave) frequency band. A ground plane is formed on at least a portion of a planar surface of the multilayer PCB. Two metal components are physically attached to the multilayer PCB and electrically coupled to the ground plane. A monopole antenna is positioned vertically through one or more layers of the multilayer PCB. The antenna is positioned proximate to one lateral side of the multilayer PCB, and aligned between the two metal components. Vertical stubs are formed through the multilayer PCB, vertically aligned with the monopole antenna, and spaced to a side of the monopole antenna opposite to the one lateral side of the multilayer PCB. Each vertical stub is electrically grounded to the ground plane. The two metal components and the vertical stubs shape beam directivity of the monopole antenna.

20 Claims, 22 Drawing Sheets

(51) Int. Cl.

| | | |
|---|---|---|
| *G06F 1/16* | (2006.01) | |
| *H05K 1/18* | (2006.01) | |
| *H05K 1/02* | (2006.01) | |
| *H05K 3/40* | (2006.01) | |
| *H01Q 19/06* | (2006.01) | |
| *H01Q 19/10* | (2006.01) | |
| *H01Q 19/13* | (2006.01) | |
| *H01Q 19/32* | (2006.01) | |
| *H01Q 21/08* | (2006.01) | |
| *H01Q 9/30* | (2006.01) | |
| *H01Q 21/20* | (2006.01) | |

(56) References Cited

U.S. PATENT DOCUMENTS

2008/0291104 A1* 11/2008 Kanno ............... H01Q 13/10
343/767
2014/0028515 A1* 1/2014 Lu ..................... H01Q 1/36
343/793

OTHER PUBLICATIONS

Zhang, Yanyan et al., "An Ultra Small Integrated Monopole Antenna Using High-Density Periodic Substrate Metalllization", U.R.S.I., Proceedings, General Assembly, Chicago IL, (Aug. 2008).

* cited by examiner

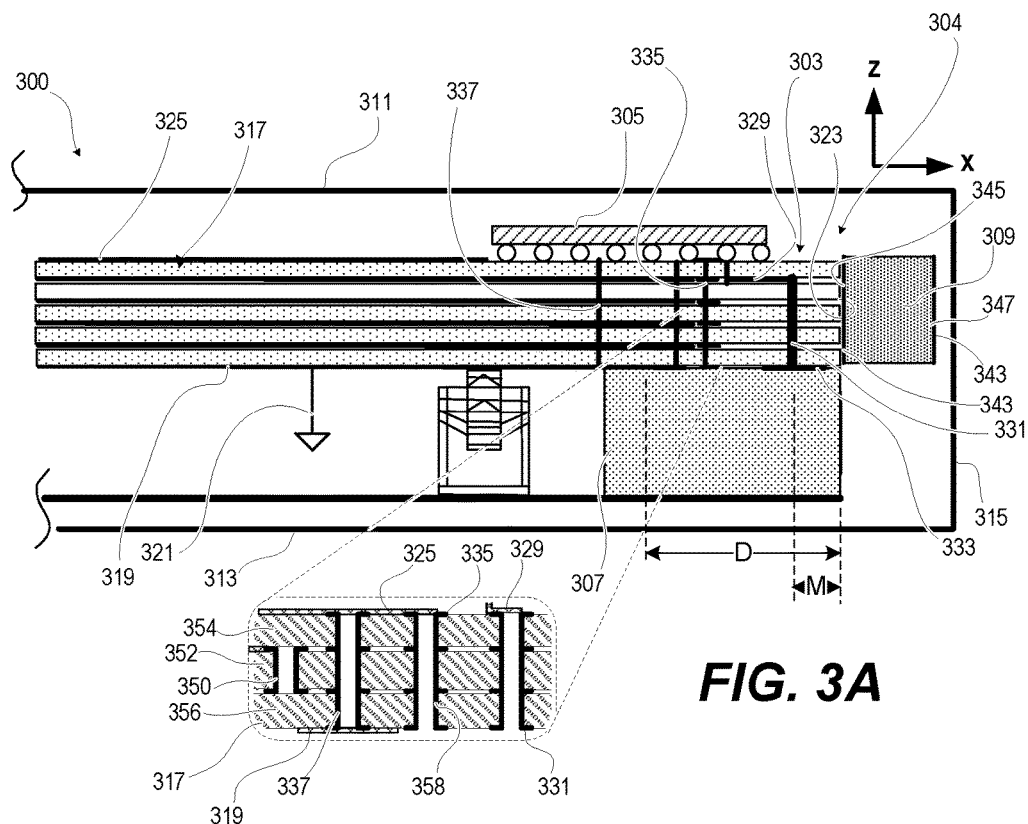
FIG. 3A
FIG. 3B
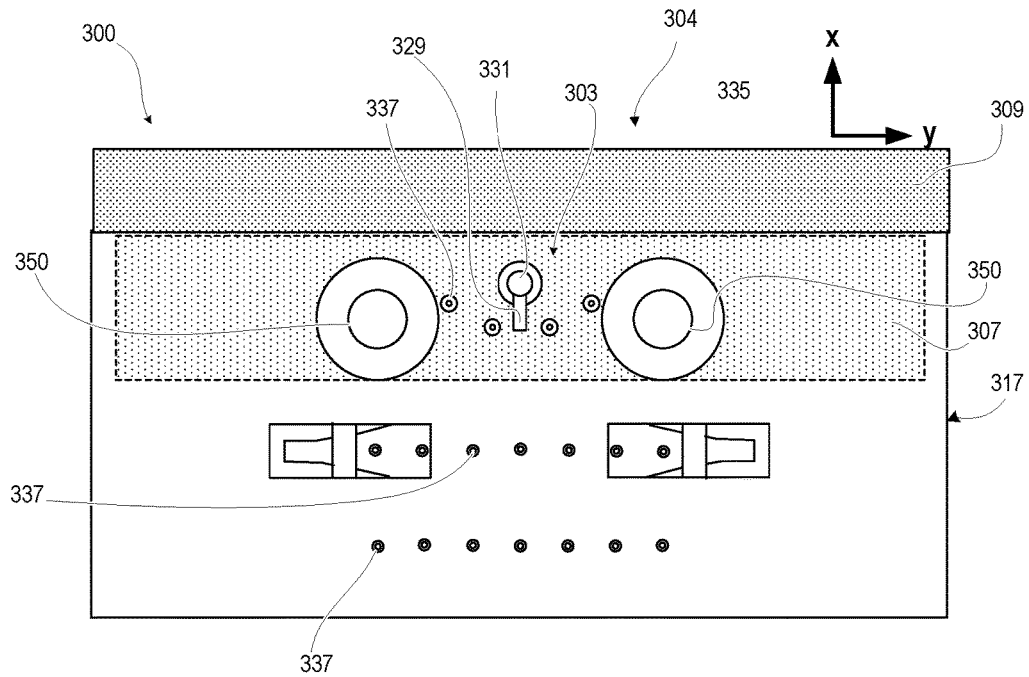
FIG. 4

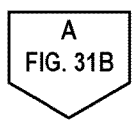

```
                        ┌─────────┐                           ⟋─3100
                        │    A    │
                        │ FIG. 31B│
                        └────┬────┘
                             ▼
┌───────────────────────────────────────────────────────────────────┐
│ Attach a transceiver integrated circuit on one side of the        │
│ multilayer PCB proximate to the monopole antenna and electrically │
│ connected to the monopole antenna                                 │
│                              3120                                 │
└───────────────────────────┬───────────────────────────────────────┘
                            ▼
┌───────────────────────────────────────────────────────────────────┐
│ Add vertical parasitic antenna elements on a selected at least    │
│ one of an inner surface and an outer surface of a second          │
│ dielectric material that when installed on the multilayer PCB is  │
│ aligned with the monopole antenna to increase directivity of the  │
│ antenna assembly                                                  │
│                              3122                                 │
└───────────────────────────┬───────────────────────────────────────┘
                            ▼
┌───────────────────────────────────────────────────────────────────┐
│ Attach a first dielectric material on another side of the         │
│ multilayer PCB proximate to the monopole antenna and opposite     │
│ to the transceiver integrated circuit                             │
│                              3124                                 │
└───────────────────────────┬───────────────────────────────────────┘
                            ▼
┌───────────────────────────────────────────────────────────────────┐
│ Attach a second dielectric material to the one side of the        │
│ multilayer PCB proximate to the monopole antenna and in the       │
│ directivity direction                                             │
│                              3126                                 │
└───────────────────────────┬───────────────────────────────────────┘
                            ▼
┌───────────────────────────────────────────────────────────────────┐
│ Attach the multilayer PCB to a device chassis of an electronic    │
│ device with screw bosses in the pair of adjacent holes            │
│                              3128                                 │
└───────────────────────────┬───────────────────────────────────────┘
                            ▼
                        ( END )
```

*FIG. 31B*

ELECTRONIC DEVICE HAVING MILLIMETER WAVE ANTENNAS

TECHNICAL FIELD

The present disclosure relates generally to an electronic communication device, and more particularly to a low-profile antenna system of the electronic communication device.

BACKGROUND

Generally-known smart phones and other mobile communication devices, or user equipment (UEs), in the 5th generation Long Term Evolution of wireless communications (5G LTE) will employ planar antenna arrays in order to have higher directive gains over single antenna or diversity antenna configurations. The higher directive gains are needed to circumvent the increased path loss at millimeter wave (mmWave) frequencies. However, planar antenna arrays have scanning limitations. For example, a 4×4 patch array facing out the back of a user device or user equipment (UE) can scan approximately ±30 degrees off the boresight of the planar antenna. Additionally, with a planar patch antenna array facing out of the backside of a UE, there are two additional problems related to scanning incoming signals at 90 degrees from the boresight of the antenna. A first problem is the peak gain at 90 degrees is significantly lower compared to the peak gain at the boresight (0 degrees) of the antenna. A second problem is that the gain of the antenna side lobes directed away from scanned direction of interest will become larger than the gain of the desired main lobe in the desired direction. As a result, the signal to noise ratio (SNR) will be lower in the desired receive direction than in an undesired direction.

BRIEF DESCRIPTION OF THE DRAWINGS

The description of the illustrative embodiments is to be read in conjunction with the accompanying drawings, wherein:

FIG. 3A illustrates a front-side cutaway view of an example UE incorporating a top-mounted transceiver, bottom and lateral dielectric material blocks, and a single monopole antenna version of an mmWave antenna system, according to one or more embodiments;

FIG. 3B illustrates a detail front-side cutaway view of the multilayer PCB of FIG. 3A, according to one or more embodiments;

FIG. 4 illustrates a top view of the example UE of FIG. 3, according to one or more embodiments;

FIGS. 31A-31B illustrate a flow diagram of a method of making an mmWave antenna system of a UE, according to one or more embodiments.

DETAILED DESCRIPTION

Figure 1:
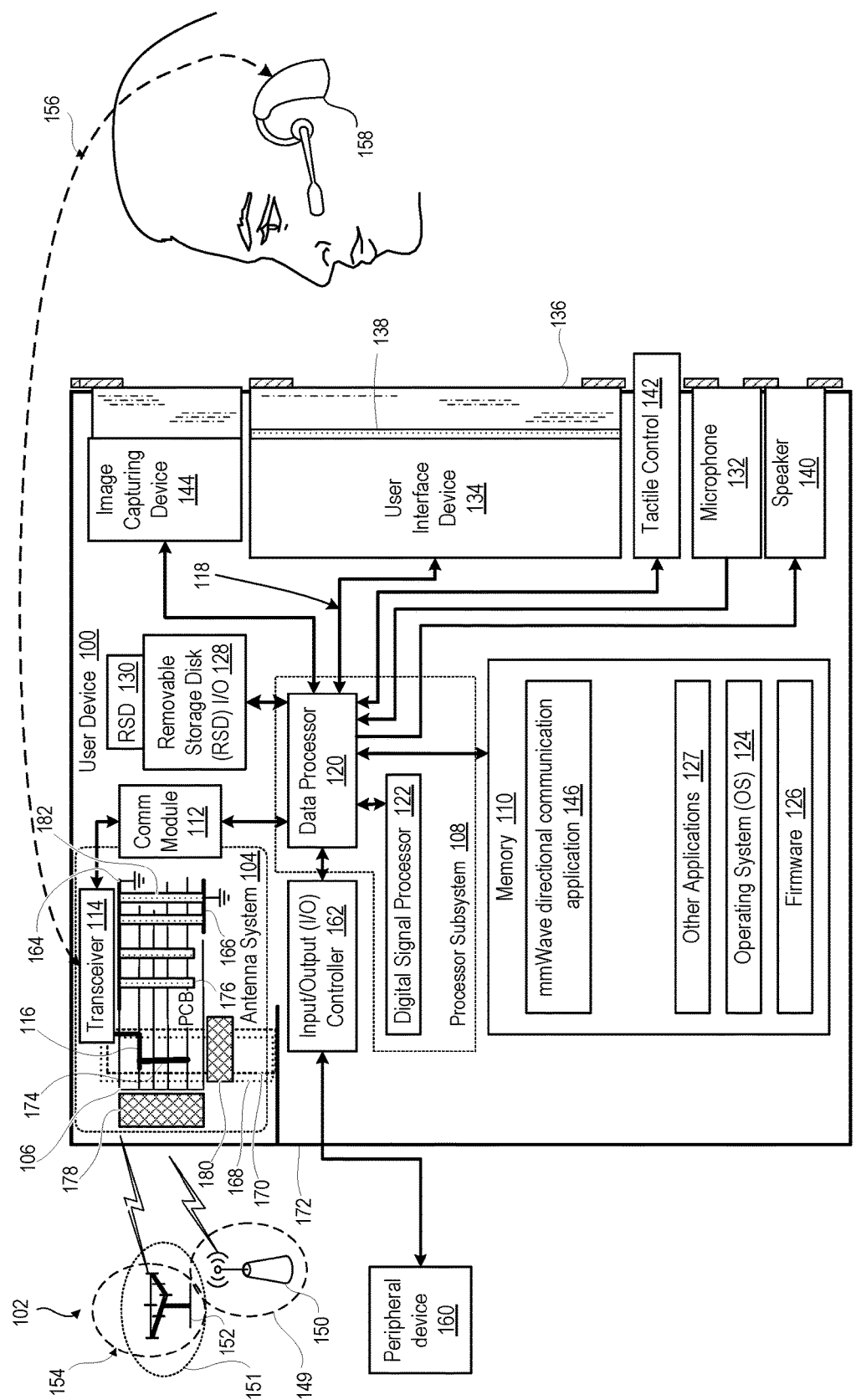
FIG. 1 illustrates a functional block diagram of a user equipment (UE) incorporating a millimeter wave (mmWave) antenna system, according to one or more embodiments.

The illustrative embodiments of the present disclosure provide a substrate integrated driven monopole antenna that is formed as stacked vias in a multilayer printed circuit board (PCB). The monopole antenna is accompanied by closely spaced grounded vertical stubs which are also formed as stacked vias. The entire assembly, referenced herein as a monopole radiating system, resides on a device chassis that is connected to the PCB ground by universal metal connectors or metal cylinders. The monopole radiating system is selectively loaded with a dielectric material between the device chassis and the bottom PCB ground for impedance matching and definitive beam formation. The dielectric material can also be on the top layer of the PCB. Additionally, the monopole radiating system is loaded with two metal screw bosses or metal cylinders on two sides to enhance the directivity in the desired direction. When loaded with a second dielectric material at a lateral edge of the PCB, the monopole radiating system further increases the directivity. The second dielectric material can have parasitic directors printed on the outer and inner layers.

The present innovation contemplates and addresses how antennas are critical devices for transmitting and receiving radio wireless signals on a mobile communication device or user equipment (UE). In what is considered the 5th generation of wireless communications in the Long Term Evolution (LTE) of mobile communications, sometimes referred to as 5G LTE, millimeter wave (mmWave) frequency bands designated for transmission and reception of wireless signals within the 24 GHz to 110 GHz frequency range will most likely be utilized.

UEs that operate in the 5G LTE communications mode may employ planar antenna arrays. In one example, the patch array can include a 4×4 array of microstrip patch antennas facing a back side of the UE, which typically is facing away from the user interface side of the UE. Planar antenna arrays, such as the patch array, provide higher directive gains than, for example, a single patch antenna configuration. The use of an array of microstrip patch or other antennas helps to circumvent the larger path or propagation loss that occurs at the mmWave RF frequencies.

The present disclosure recognizes that planar antennas, such as the patch array, have scanning limitations. That is, by selectively varying the phase of the transmission signal to the patch antennas, the 4×4 array of patch antennas can be used to steer the radiation beam up to only about 30 degrees off the Z-axis normal to the back side toward the ±X and/or ±Y directions toward the lateral edges. A main radiation lobe is centrally located on the Z-axis bore sight with relatively small side lobes. The peak gain is at 0 degrees on the Z-axis and the gain is significantly lower at 90 degrees from the Z-axis in the X-Y plane. When the beam scanning angle is steered at an angle larger than about 30 degrees from the boresight, a side lobe at an unwanted direction increases significantly. The side lobe adversely affects the gain and signal to noise ratio (SNR) of the RF signals when the steered angle of the main lobe is greater than 30 degrees from the Z-axis.

The present disclosure contemplates that what is needed is an antenna design that can also be incorporated into a UE and can enable the UE to transmit and receive mmWave signals in directions greater than 30 degrees from the boresight or Z-axis of the UE device. According to the present innovation, an antenna system is provided that can transmit and receive mmWave signals in the X and Y directions out of the lateral sides of the UE device with an acceptably high gain at about ±60 degrees from the X-Y plane in Z directions. In an exemplary embodiment, the present disclosure provides an antenna element/array that has a high gain at 90 degrees from the Z-axis and is readily incorporated into a UE.

According to aspects of the present innovation, an electronic device includes a computing environment having active components attached to and functionally interconnected on more than one layer of a multilayer printed circuit board (PCB). A planar surface of each layer of the multilayer PCB defines a horizontal plane. A communication module is in communication with the active components of the computing environment and propagates in a millimeter wave (mmWave) frequency band for transmitting and receiving signals. At least one ground plane is formed on at least a portion of a planar surface of the multilayer PCB. Two or more metal components are physically attached to the multilayer PCB and electrically coupled to the at least one ground plane. A monopole antenna is electrically connected to the input/output component. The monopole antenna is formed vertically through one or more layers of the multilayer PCB and positioned proximate to one lateral side of the multilayer PCB. The monopole antenna is aligned between two adjacent ones of the two or more metal components. One or more vertical stubs are formed through the multilayer PCB and vertically aligned with the monopole antenna. The one or more vertical stubs are spaced to a side of the monopole antenna opposite to the one lateral side of the multilayer PCB. Each vertical stub is electrically grounded to the ground plane. The two adjacent ones of the two or more metal components and the one or more vertical stubs shape beam directivity of the monopole antenna toward the one lateral side of the multilayer PCB.

According to aspects of the present innovation, an antenna assembly includes a multilayer PCB. A planar surface of each layer of the multilayer PCB defines a horizontal plane. An input/output component is attached to a selected planar surface of the PCB and connectable to a communication module for propagating signals in an mmWave band. At least one ground plane is formed on at least a portion of a planar surface of the multilayer PCB. Two or more metal components are physically attached to the multilayer PCB and electrically coupled to the at least one ground plane. A monopole antenna is electrically connected to the input/output component, positioned vertically through one or more layers of the multilayer PCB. The monopole antenna is positioned proximate to one lateral side of the multilayer PCB. The monopole antenna is aligned between two adjacent ones of the two or more metal components. One or more vertical stubs are formed through the multilayer PCB. The one or more vertical stubs are vertically aligned with the monopole antenna. The one or more vertical stubs are spaced to a side of the monopole antenna opposite to the one lateral side of the multilayer PCB. Each vertical stub is electrically grounded to the ground plane. The two adjacent ones of the two or more metal components and the one or more vertical stubs shape beam directivity of the monopole antenna toward the one lateral side of the multilayer PCB.

According to aspects of the present innovation, a method includes making a plurality of aligned vertical holes in a multilayer PCB having more than one layer. Each layer has a planar surface defining a horizontal plane. The plurality of aligned vertical holes include an antenna hole positioned proximate to one lateral side of the multilayer PCB. The plurality of aligned vertical holes include a pair of adjacent holes on each side of the antenna hole. The pair of adjacent holes are aligned with the one lateral side and are sized to receive a respective screw boss that mechanically attaches the multilayer PCB to a device chassis. The plurality of aligned vertical holes include one or more vertical stub holes on a side of the antenna hole opposite to the one lateral side of the multilayer PCB. The method includes making a monopole antenna as a stacked via in the antenna hole. The monopole antenna is sized to propagate signals in an mmWave frequency band. At least one ground plane is attached on one planar surface of the multilayer PCB. The method includes forming one or more vertical stubs as stacked vias in the one or more vertical stub holes through the multilayer PCB; the vertical stubs are in electrical connection to the at least one ground plane. The vertical stubs and the screw bosses attaching the multilayer PCB to a device chassis shape the beam directivity of the monopole antenna toward the one lateral side of the multilayer PCB.

In the following detailed description of exemplary embodiments of the disclosure, specific exemplary embodiments in which the various aspects of the disclosure may be practiced are described in sufficient detail to enable those skilled in the art to practice the innovation, and it is to be understood that other embodiments may be utilized and that logical, architectural, programmatic, mechanical, electrical and other changes may be made without departing from the spirit or scope of the present disclosure. The following detailed description is, therefore, not to be taken in a limiting sense, and the scope of the present disclosure is defined by the appended claims and equivalents thereof. Within the descriptions of the different views of the figures, similar elements are provided similar names and reference numerals as those of the previous figure(s). The specific numerals assigned to the elements are provided solely to aid in the description and are not meant to imply any limitations (structural or functional or otherwise) on the described embodiment. It will be appreciated that for simplicity and clarity of illustration, elements illustrated in the figures have not necessarily been drawn to scale. For example, the dimensions of some of the elements are exaggerated relative to other elements.

It is understood that the use of specific component, device and/or parameter names, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

As further described below, implementation of the functional features of the disclosure described herein is provided within processing devices and/or structures and can involve use of a combination of hardware, firmware, as well as several software-level constructs (e.g., program code and/or program instructions and/or pseudo-code) that execute to provide a specific utility for the device or a specific functional logic. The presented figures illustrate both hardware components and software and/or logic components.

Those of ordinary skill in the art will appreciate that the hardware components and basic configurations depicted in the figures may vary. The illustrative components are not intended to be exhaustive, but rather are representative to highlight essential components that are utilized to implement aspects of the described embodiments. For example, other devices/components may be used in addition to or in place of the hardware and/or firmware depicted. The depicted example is not meant to imply architectural or other limitations with respect to the presently described embodiments and/or the general invention. The description of the illustrative embodiments can be read in conjunction with the accompanying figures. Embodiments incorporating teachings of the present disclosure are shown and described with respect to the figures presented herein.

Turning now to FIG. 1, there is depicted a block diagram representation of an example electronic device, such as UE 100, within which several of the features of the disclosure can be implemented. In an exemplary aspect, UE 100 includes the hardware and software to support various wireless or wired communication functions as part of a communication system 102. The UE 100 can be one of a host of different types of devices, including but not limited to, a mobile cellular phone or smart-phone, a laptop, a net-book, an ultra-book, and/or a tablet computing device. The UE 100 may be portable or fixed.

According to the general illustration, UE 100 includes a radiating monopole antenna system, illustrated as one or more antenna systems 104, that are integrated and functionally interconnected with active components of a computing environment on more than one layer of a multilayer printed circuit board (PCB) 106. A planar surface of each layer of the multilayer PCB defines a horizontal plane. Active components of the computing environment can include, for example, a processor subsystem 108, memory 110 and communication module 112. The communication module 112 is communicatively connected with the active components of the computing environment, such as the processor subsystem 108. Communication module 112 sends and/or receives communication information with a transceiver integrated circuit 114. The transceiver integrated circuit 114 transmits communication in a millimeter wave (mmWave) band via an input/output component 116 that couples to the antenna system 104 for propagating an mmWave signal. Similarly, a received signal on the antenna system 104 is propagated via the input/output component 116 to the transceiver integrated circuit 114. The input/output component can be conductive trace formed on a layer of the multilayer PCB 106.

Referring now to the specific component makeup and the associated functionality of the presented components, processor subsystem 108 can be an integrated circuit (IC) that connects, via a plurality of bus interconnects 118 (illustrated by the bi-directional arrows), to a plurality of functional components of UE 100. Processor subsystem 108 can include one or more programmable microprocessors, such as data processor 120 and digital signal processor (DSP) 122, which may both be integrated into a single processing device, in some embodiments. Processor subsystem 108 controls the communication, user interface, and other functions and/or operations of UE 100. These functions and/or operations thus include, but are not limited to, application data processing and signal processing. The UE 100 may use hardware component equivalents such as special purpose hardware, dedicated processors, general purpose computers, microprocessor-based computers, micro-controllers, optical computers, analog computers, dedicated processors and/or dedicated hard wired logic. Connected to processor subsystem 108 is memory 110, which can include volatile memory and/or non-volatile memory. Memory 110 stores software, such an operating system 124 and firmware 126. One or more other executable applications 127 can also be stored within memory 110 for execution by processor subsystem 108. Memory 110 may be augmented by data storage, illustrated as removable storage device (RSD) 130, which is received in/at RSD input/output (I/O) interface 128. Storage can be a fixed, internal storage, in one embodiment.

UE 100 can include input and output devices having different respective I/O functionality. For example, microphone 132 can receive user audible inputs. As another example, user interface device 134 can present visual or tactile outputs as well as receive user inputs. In one example, user interface device 134 can include a touch screen 136 that covers a display 138. An audio speaker 140 can provide audible sound output, which can also augment the presentation of the visual or tactile outputs of user interface device 134. A tactile control 142 can provide an interface such as for braille reading, haptic outputs, or manual inputs. Image capturing devices 144, such as cameras, can capture images as well as provide imagery for gesture controls and facial recognition among other purposes.

The processor subsystem 108 can execute applications contained in memory 110. One or more of these applications, such as an mmWave directional communication application 146, can utilize the antenna system 104 for communication. Having two or more antenna systems 104 with different antenna directivities can be used for spatial diversity and increased antenna gain. The mmWave directional communication application 146 can select and interface to a particular antenna system 104 having gain toward a remote network to mitigate interference and channel fading. Memory 110 can contain other applications 127. In one or more embodiments, UE 100 supports wireless communication, via the communication module 112, in various communication protocols. Transceiver IC 114 can be capable of supporting mmWave and other frequencies. These frequencies include ones that are appropriate for a wireless local area network (WLAN) 149, illustrated as including a node 150. These frequencies can include ones that are appropriate for a radio access network (RAN) 152 of a wireless wide area network (WWAN) 151 or cellular network 154. These frequencies can include ones appropriate for a near field or personal access network (PAN) 156. In certain embodiments, UE 100 may also support communication with a hardwired local access network (LAN) or peripheral devices 160 via an I/O controller 162. PAN 156 is illustrated as including BLUETOOTH headset device 158 that communicates with the user device 100.

The antenna system 104 has top and bottom ground planes 164, 166 formed on opposing planar surfaces of the multilayer PCB 106. Two metal components 168, 170 such as screw bosses are physically attached to the multilayer PCB and to a device chassis or housing 172 of the user device 100. The two metal components 168, 170 are electrically coupled to at least one ground plane 164, 166. A monopole antenna 174 is electrically connected to the input/output component 116. The monopole antenna 174 is formed vertically through one or more layers of the multilayer PCB 106. The monopole antenna 174 is positioned proximate to one lateral side of the multilayer PCB 106. The monopole antenna 174 is aligned between the two metal components 168, 170. Vertical stubs 176 are formed through the multilayer PCB 106. Vertical stubs 176 are vertically aligned with monopole antenna 174. Vertical stubs 176 are spaced to a side of monopole antenna 174 opposite to the one lateral side of the multilayer PCB 106. Each vertical stub 176 is electrically grounded to one of the ground planes 164, 166. For enhancing directivity of the antenna system 104, a first dielectric material 178 can be placed proximate to the lateral side of the multilayer PCB 106 toward the directivity direction. A second dielectric material 180 can be placed against a planar surface of the multilayer PCB 106 proximate to the monopole antenna 174 and opposite to the transceiver 114. Vertical conductive elements 182 are electrically connected between the top and bottom ground planes 164, 166. Vertical conductive elements 182 are adjacent to the one or more vertical stubs 176. Vertical conductive elements 182 are on an opposite side of the two metal components and the vertical monopole antenna 174 to the one lateral side of the multilayer PCB. The two metal components 168, 170, the one or more vertical stubs 176, the first and second dielectric materials 178, 180, and the vertical conductive elements 182 shape the beam directivity of the monopole antenna 174 toward the one lateral side of the multilayer PCB 106. In one or more exemplary embodiments, each of the vertical monopole antenna 174, vertical stubs 176 and vertical conductive elements 182 are formed as stacked vias. Each vertical monopole antenna 174 has one end that is electrically isolated and another end electrically attached to the input/output component 116. Each vertical stub 176 has one electrically isolated end and one end electrically attached to a single ground plane 164, 166. Each vertical conductive element 182 is attached at respective ends to both ground planes 164, 166.

A via, which is Latin for path or way and also known as vertical interconnect access, is an electrical connection between layers in a physical electronic circuit that goes through the plane of one or more adjacent layers. In printed circuit board design, a via consists of two pads in corresponding positions on different layers of the board. The two pads are electrically connected by a hole through the board. The hole is made conductive by electroplating or is lined with a tube or a rivet.

Figure 2:
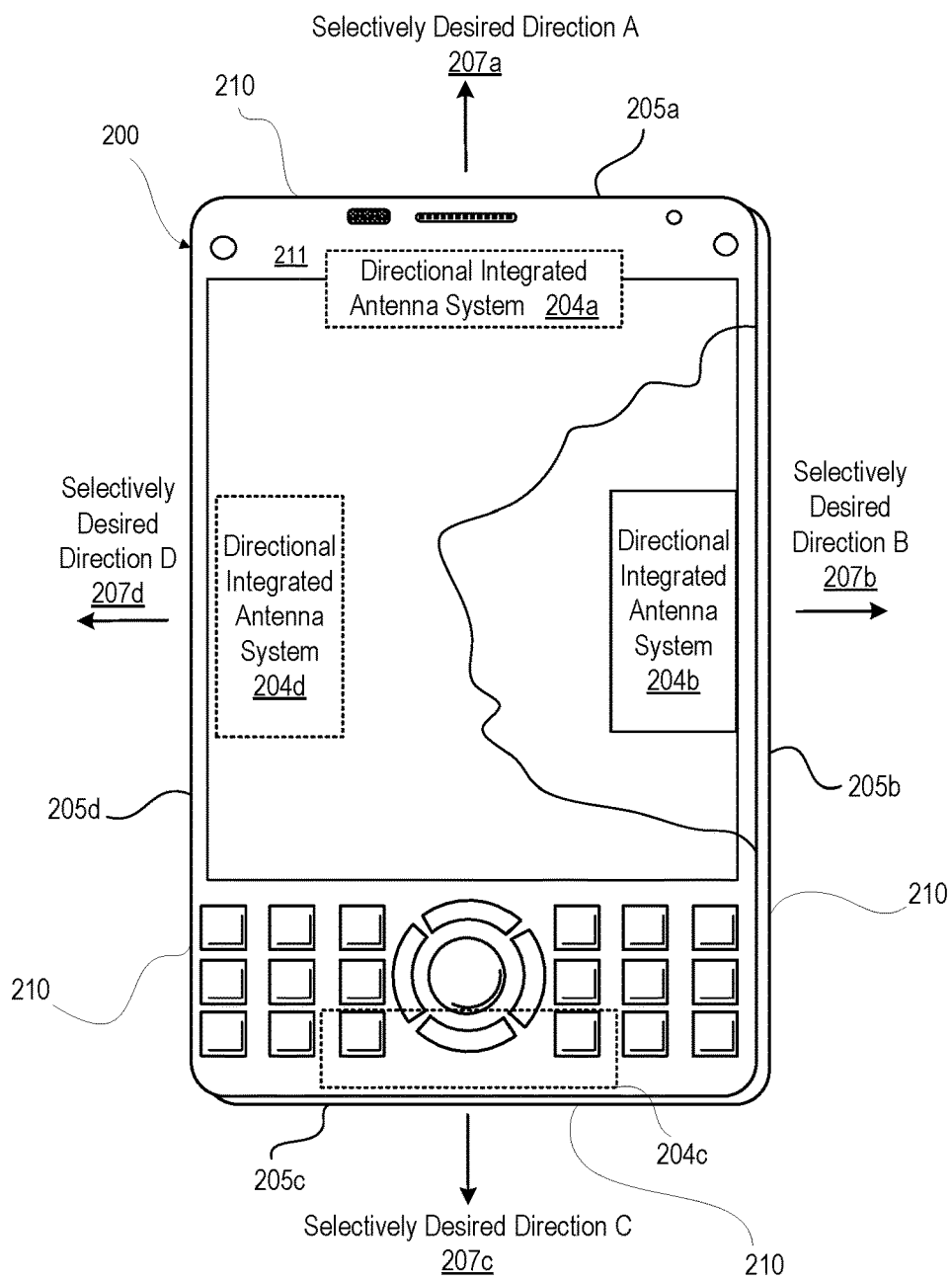
FIG. 2 illustrates a front-side view of an example UE incorporating an mmWave antenna system for each lateral side, according to one or more embodiments.

FIG. 2 illustrates an example UE 200 that has four antenna systems 204a-204d that are each aligned with a respective lateral edge 205a-205d and having a respective directivity direction 207a-207d. The four antenna systems 204a-204d have antenna directivity in a selected one of four quadrants. Each of the four antenna systems 204a-204d can be formed from a selected configuration as described below. One or more of antenna systems 204a-204d can be selected for propagating signals based on factors such as a detected position of an interfering source, contact with a user on a particular portion of the UE 200, and direction of a remote transceiving network. In one or more embodiments, the antenna systems 204a-204d have a low profile such that the antenna systems 204a-204d can be installed in a UE 200.

Antenna systems 204a-204d provide improved antenna gain parallel to the face and back of the UE 200 out of an edge or edges 210 of the UE.

FIGS. 3A-3B and 4 illustrate an example UE 300 incorporating a single radiating monopole arrangement 303 in a low-profile mmWave antenna system 304. With particular reference to FIG. 3A, a top-mounted transceiver integrated circuit (IC) 305 is coupled to the mmWave antenna system 304. Beam shaping bottom dielectric material block 307 and lateral dielectric material block 309 are positioned beside the antenna system 304. The UE 300 has a backside 311 and a front side 313. In some embodiments, the backside 311 may face away from the user when the UE 300 is held against the user's ear during wireless mobile communication. For simplification in this discussion, the Z-axis or direction is perpendicularly away from or out of the backside 311 as shown. A side edge 315 is located between the backside 311 and front side 313 of the UE 300. In this discussion, side edge 315 is basically perpendicular to the X-axis or X-direction, as shown, but this is not intended to be viewed as a limitation or requirement.

In one or more embodiments, multilayer PCB 317 has a ground plane 319 connected to a device chassis ground 321. The multilayer PCB 317 has at least three (3) layers of substrate on which printed circuitry may be placed, but may have from 3 to N layers, were N is a positive integer greater than 3. In FIG. 3, the first substrate layer 1 of the PCB 317 is on or proximate to the front side of the PCB 317 and the Nth substrate layer is on or proximate to the backside of the PCB 317. A front ground plane 319 covers a portion of the first substrate layer 1. The portion of the first substrate layer 1 that is covered by the ground plane is spaced at a predetermined distance D from a side edge 323 of the PCB 317.

A second ground plane or backside ground plane 325 is located over (or covers) a backside surface of the Nth layer of the PCB 317. The transceiver IC 305 is mounted on the backside of the multilayer PCB 317. The transceiver IC 305 has a plurality of circuit connections that connect to circuitry on the PCB 317. Although the transceiver IC 305 may have one or more ground connections to the backside ground plane 325, other connections extend through the ground plane to circuitry on other sides/layers of the multilayer PCB 317. The transceiver IC 305 has an antenna connection 329 that connects to a first end of a vertical monopole antenna 331 and enables transceiver circuitry to drive or receive signals to and from the vertical monopole antenna 331. The vertical monopole antenna 331 comprises stacked conductive vias that are connected to continuously extend in a linear manner from and through the N-1 substrate layer to and through the 1st layer of the PCB 317. In some embodiments, the vertical monopole 331 extends through a plurality of contiguous layers within the multilayer PCB 317. The vertical monopole 331 is spaced a distance M from the side edge 323 of the PCB 317. In some embodiments, a top hat load 333 is placed at a second or distal end of the vertical monopole. The top hat load can be in the form of a flat conductive portion connected at a central location to the second end of the vertical monopole 331. The top hat load 333 effectively increases the electrical length of the vertical monopole antenna. The overall length of the vertical monopole antenna 331 within the substrate layers of the PCB 317 is about $0.2\lambda$, where $\lambda$ is the wavelength of the lowest mmWave frequency to be transmitted or received. Thus, for an mmWave frequency of 28 GHz, the length of the vertical monopole 331 should be at least 2.2 mm for a certain dielectric constant. Also, in some embodiments, the vertical monopole 331 is easily accommodated within and through PCB substrate layers having a combined thickness of 2.2 mm.

FIG. 3B illustrates that the multilayer PCB 317 can include vias 350 that are formed through one layer, such as a middle core layer 352 between a top layer 354 and a bottom layer 356. Each stacked via 358 is two or more vertically aligned and connected vias 350 that pass through respective layers 352-356 of the multilayer PCB 317. Each one of the vertical stubs 335 comprises stacked vias 358 connected to continuously extend in a vertical linear manner from the backside ground plane 325 through a plurality of the PCB substrate layers 352-356 to the front side ground plane 319. FIG. 3A illustrates that each one of the plurality of vertical stubs 335 are positioned a distance between D and M from the side edge 323 of the multilayer PCB 317. FIG. 3B illustrates that each one of the plurality of vertical stubs 335 is grounded only at one end to one of the ground planes 319, 325, specifically the backside ground plane 325.

Additionally, various embodiments may also include a plurality of vertical conductive elements 337 each formed as a vertically stacked via 358. Each vertical conductive element 337 is grounded at both ends by being connected to both the front ground plane 319 and the backside ground plane 325. The vertically conductive elements 337 function to direct a signal radiated from the vertical monopole 331 in the X-direction and out of the side edge 315 of the UE 300.

Embodiments of the mmWave antenna system 304 may also include a first dielectric block 307 positioned on the front side of the multilayer PCB 317 and over a predefined area of the front side of the multilayer PCB 317 proximate to the vertical monopole 331 and the vertical stubs 335. The dielectric material may also be positioned between the back side of the PCB 317 and the chassis ground 321. The first dielectric blocks 307 aids impedance matching and defines beam formation in order to produce a well-defined beam, predominantly in the X-direction out of the side edge 315 of the UE 300. To further enhance the directivity of the radiation beam, a second dielectric block 309 may be positioned on or along the side edge 323 of the PCB 317. Additionally, the second dielectric block 309 may have parasitic directors 343 printed on the inner side 345 of the second dielectric block 309 proximate to the side edge 323 of the PCB 317 or on the outer side 347 of the dielectric block. The parasitic directors 343 may comprise metal or other conductive material to further increase the beam directivity.

FIG. 4 illustrates cylindrical metal components or screw bosses 350. In addition to serving a structural purpose, the cylindrical metal components or screw bosses 350 help shape the directivity of the antenna system 304. The cylindrical metal components or screw bosses 350 are placed on each side of the vertical monopole 331 along the y-axis. The screw bosses 350 can perform a structural purpose in securing the PCB 317 within the UE 300.

Figure 5:
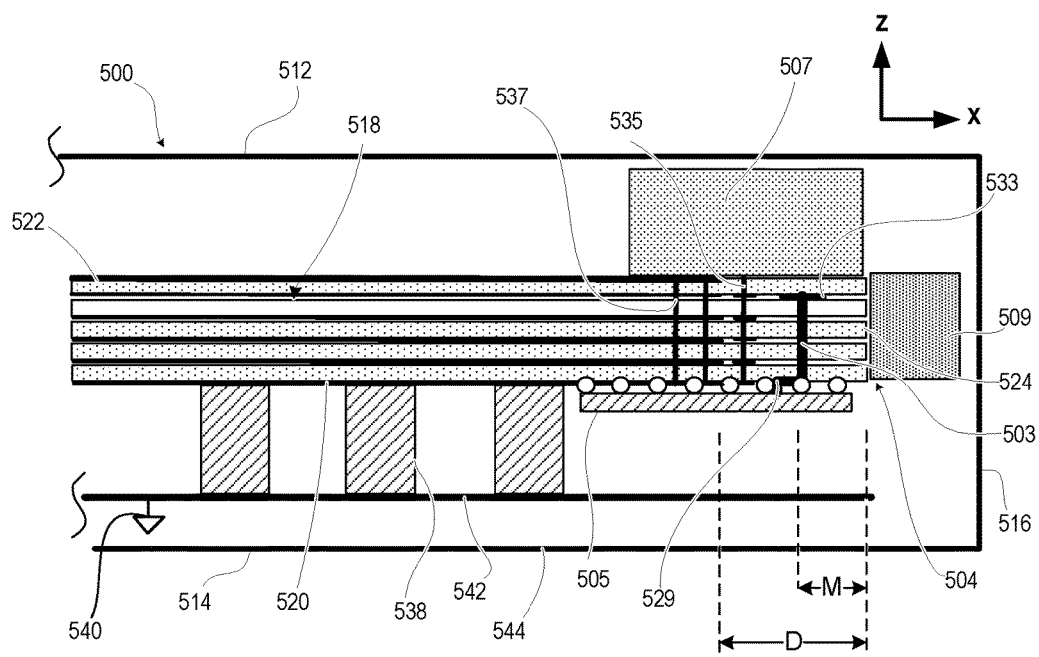
FIG. 5 provides a side view cutaway of an example UE incorporating a bottom-mounted transceiver, top and lateral dielectric material blocks, and a single monopole antenna version of an mmWave antenna system, according to one or more embodiments.

FIG. 5 illustrates an example UE 500 incorporating a single radiating vertical monopole antenna 503 in an mmWave antenna system 504. UE 500 includes a bottom-mounted transceiver integrated circuit (IC) 505 and top and lateral dielectric material blocks 507, 509. UE 500 has a backside 512 and a front side 514. In some embodiments, the backside 512 may face away from the user when the UE 500 is held against a user's ear during wireless mobile communication. To simplify this discussion, the Z-axis or direction is shown to be perpendicularly away from or out of the backside 512 of the UE 500. A lateral side edge 516 of the UE 500 is orthogonal to and peripherally positioned between the back side 512 and the front side 514 of UE 500. The lateral side edge 516 is perpendicular to the X axis.

The mmWave antenna system 504 has a multilayer PCB 518 having at least three layers of substrate on which printed circuitry may be placed. The thickness of the multilayer PCB 518 is at least 0.2λ, where λ is the wavelength of the lowest mmWave frequency to be propagated by the mmWave antenna system 504. The multilayer PCB 518 may have from 3 to N layers, where N is a positive integer. In FIG. 5, the first layer of the multilayer PCB 518 is on the front side of the PCB 518 and the Nth layer is on the backside of the PCB 518. The front side of PCB 518 is the side of the PCB closest to the front side 514 of the UE 500 and the back side 512 of PCB 518 is the side of the PCB 518 closest to the backside 512. In this embodiment, a front side ground plane 520 covers a significant portion of the front side of the first substrate layer 1. The backside ground plane 522 covers a portion of the Nth substrate layer or in other embodiments the backside of the PCB 518. A portion of the Nth substrate layer or backside of the PCB 518 that is covered by the ground plane 522 is spaced from a side edge 524 of the PCB 518 a predetermined distance D. The side edge 524 of the PCB 518 may run parallel with a portion of the side edge 516 of the UE 500.

The front ground plane 520 substantially covers the surface of the first layer of the multilayer PCB 518. A transceiver IC 505 is shown mounted on the first layer or front side of the multilayer PCB 518. The transceiver IC 505 comprises a plurality of circuit connections that connect to circuitry on various layers of the PCB 518 via solder balls, vias, or other known techniques that connect integrated circuits to the circuitry of printed circuit boards. Although the transceiver IC 505 may have one or more connections that electrically connect to the front side ground plane 520, many of the connections of transceiver IC 505 extend through openings in the front side ground plane 520 to circuitry within the multilayer PCB 518. Transceiver IC 505 has an antenna connection 529 that connects to a first end of a vertical monopole antenna 503. This connection 529 enables the transceiver circuitry to transmit and receive signals to and from the vertical monopole antenna 503. In various embodiments, the vertical monopole antenna 503 comprises of stacked and connected conductive vias that extend in a linear manner from the first end of monopole antenna 503 and through the first N-1 layers of the multilayer PCB 518. The vertical monopole antenna 503 is spaced at a horizontal distance M from the side edge 524 of the PCB 518. In some embodiments, a top hat load 533 is positioned at a second distal end of the vertical monopole antenna 503. The top hat load 533 is formed of a flat conductive portion connected at a central location to the second distal end of the monopole 503. The top hat load 533 is perpendicular to the vertical monopole antenna 503 and may be positioned between layers of the multilayer PCB 518. The top hat load 533 effectively increases the electrical length of the vertical monopole antenna 503. By effectively increasing the electrical length, the top hat load 533 thereby enables some embodiments to have monopole antennas that are shorter than 0.2λ, where λ is the wavelength of the lowest mmWave frequency band to be propagated by vertical monopole antenna 503. In this embodiment, the vertical monopole antenna 503 extends within the multilayer PCB 518 from the transceiver IC 505 toward the backside of the UE 500.

The mmWave antenna system 504 may also include a plurality of vertical stubs 535. Each of vertical stubs 535 may include stacked conductive vias connected to continuously extend in a linear manner from the front side ground plane 520 through a plurality of consecutive PCB layers. Each one of the plurality of vertical stubs 535 are positioned less than the distance D from the side edge 524 of the PCB 518. Each one of the plurality of vertical stubs 535 are grounded at one end. In this configuration, vertical stubs 535 are grounded at their connection to the front ground plane 520. Embodiments may also include a plurality of grounded vertically stacked conductive vias 537. Each of the vertically stacked conductive vias 537 are grounded at both ends by being connected to both the front side ground plane 520 and the back side ground plane 522.

Embodiments may also include a first dielectric block 507 positioned on the backside of the multilayer PCB 518 and over a predefined area of the backside of the multilayer PCB 518 proximate to the vertical monopole 503 and the vertical stubs 535. The first dielectric block 507 is also positioned between the backside of the PCB and the backside of the UE 500. As in the other embodiments, this first dielectric block 507 is configured and positioned to improve impedance matching and improve definitive beam formation.

FIG. 5 also illustrates a ground connection 538 attached between a front side ground plane 540 and a chassis ground 542. All of the active components of the UE 500 are housed within an outer covering 544. The chassis ground 542 may be a physical conductive structure within the UE 500 that provides both structural integrity to various components within the UE 500 as well as a conductive ground for various circuits within the UE 500.

Figure 6:
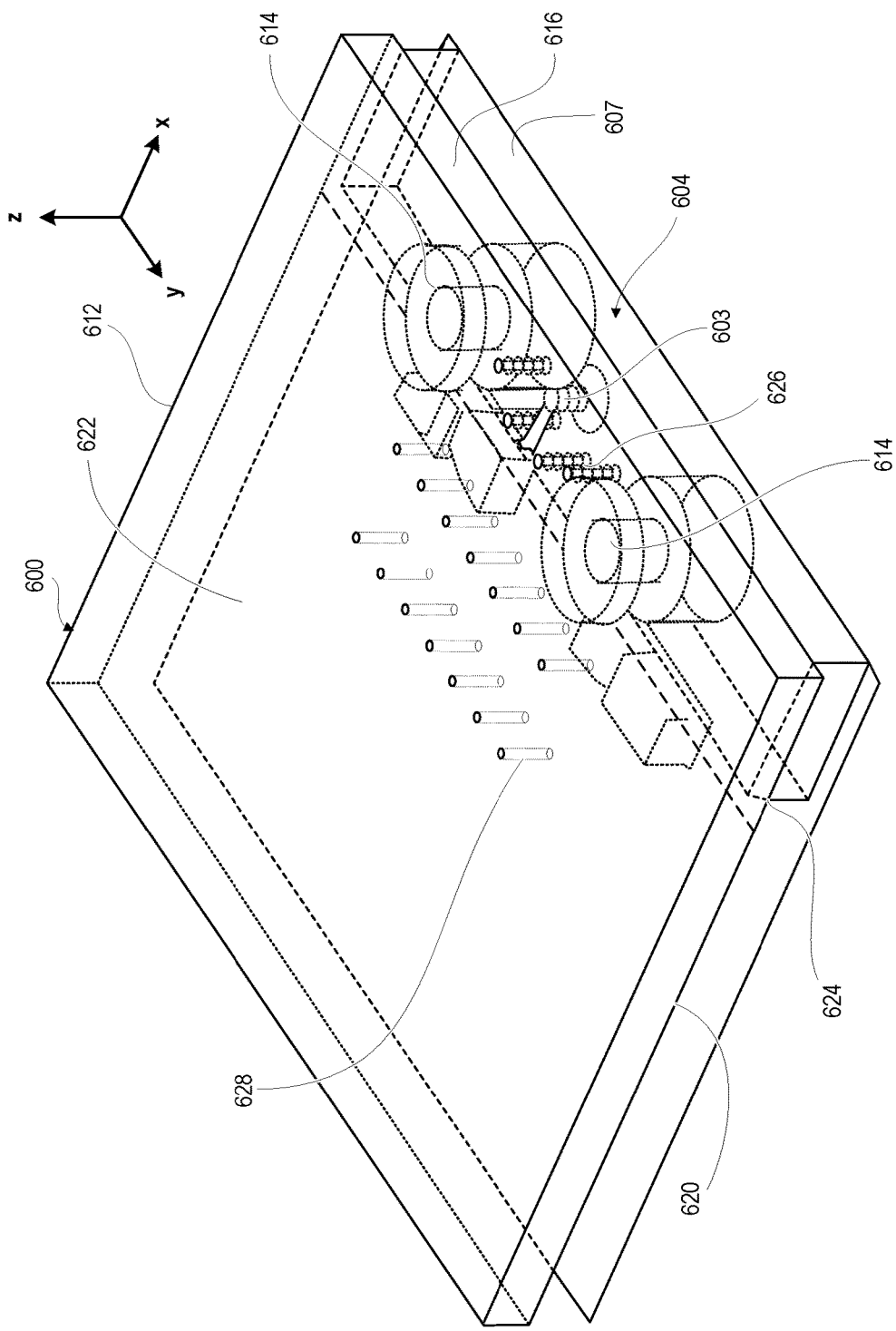
FIG. 6 illustrates an isometric view of an example UE having a bottom dielectric material block and a single radiating monopole version of an mmWave antenna system, according to one or more embodiments.
Figure 7:
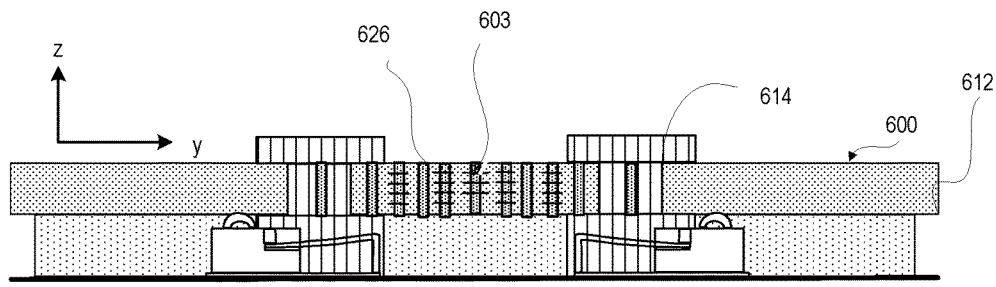
FIG. 7 illustrates a lateral side view of the example UE of FIG. 6, according to one or more embodiments.

FIGS. 6-9 illustrate an example UE 600 having a single radiating monopole antenna 603 of an mmWave antenna system 604. Beam shaping is enhanced by a single bottom dielectric material block 607. As a baseline simulation, UE 600 is similar to UEs 300, 500 (FIGS. 3, 5) but omits a lateral dielectric material block. The x-direction is out of a side edge 616 of a multilayer printed circuit board (PCB) 612 positioned inside and proximate to side edge of UE 600. The z-direction extends perpendicularly out of the backside of a multilayer PCB 612 and the UE 600. FIG. 6 illustrates an mmWave antenna system 600 incorporated into a PCB 612. This embodiment incorporates at least one screw boss 614 that is also used to enhance the beam directivity of the antenna system 604 and secure the PCB 612 in place within the UE. Two screw bosses 614 are spaced apart and located proximate to a side edge 616 of the PCB 612. A vertical monopole antenna 603 is positioned between the two screw bosses 614 and spaced a distance M (FIG. 9) from the side edge 616 of the PCB 612. The metal screw bosses 614 are thus incorporated into the mmWave antenna system 604 in order to further enhance the directivity of antenna radiation beam in a desired direction. It was found through simulation modeling that at mmWave frequencies, the metal cylinders or screw bosses 614 in this configuration have longer electrical lengths. The longer electrical length increases the directivity of the vertical monopole antenna system 600.

A plurality of vertical stubs 626 can be grounded at one end to either a backside ground plane 620 or front side ground plane 622 of the PCB 612. FIG. 6 illustrates the vertical stubs 626 grounded to the front side ground plane 622. In this embodiment, the front side ground plane 622 substantially covers the entire front surface of the PCB 612. The backside ground plane 620 covers a portion of the backside of the PCB 612, except for an area that is not covered by the backside ground plane 620 between a side edge 616 of the PCB 612 and a side edge 624 of the backside ground plane 620. The side edge 624 of the backside ground plane 620 is spaced/located a distance D (FIG. 9) from the side edge 616 of the PCB 612. Each one of the plurality of vertical stubs 626 are positioned a distance between distances D and M (FIG. 9) from the side edge 616 of PCB 612. In other words, each one of the plurality of vertical stubs 626 are positioned between the side edge 624 of the backside ground plane 620 and the side edge 616 of PCB 612. Additionally, in various embodiments each of the vertical stubs 626 are positioned at a horizontal distance selected from a range of 0.1λ, to 0.5λ, such as within about 0.15λ, from the vertical monopole antenna 603, where 2, is the lowest mmWave transceiver frequency that the mmWave antenna system 604 is expected to propagate. In this embodiment, the vertical stubs 626 are collectively shown to be in an arc shaped placement configuration relative to the vertical monopole antenna 603 and between the screw bosses 614 to further direct the antenna radiation beam in the desired positive X-direction out of the side edge 616 of PCB 612.

An array of grounded conductive vias 628 is formed and positioned a distance greater than D from the side edge 616 of the PCB 612, such that they are positioned between the back side and front side ground planes 620, 622. Each one of the conductive vias 628 is grounded at both of its ends at the front ground plane 622 and the backside ground plane 620 of the PCB 612, respectively. The grounded conductive vias 628 can be organized in various array formations in order to suppress the propagation in the substrates.

The monopole radiating system or mmWave antenna system 604 may also include a first dielectric block positioned proximate to and over the front side of the PCB 612 between the side edge 616 of the PCB and the side edge 624 of the backside ground plane 620. The single dielectric material block 607 is made of a predetermined dielectric material configured to aid impedance matching of the antenna. The single dielectric material block 607 also aids in establishing a definitive beam formation that is predominantly in the X-direction, yet includes 6-dimensional beam/lobe components: (i) X-direction; (ii) –X-direction; (iii) Y-direction; (iv) –Y direction; (v) Z direction; and (vi) –Z direction.

Figure 8:
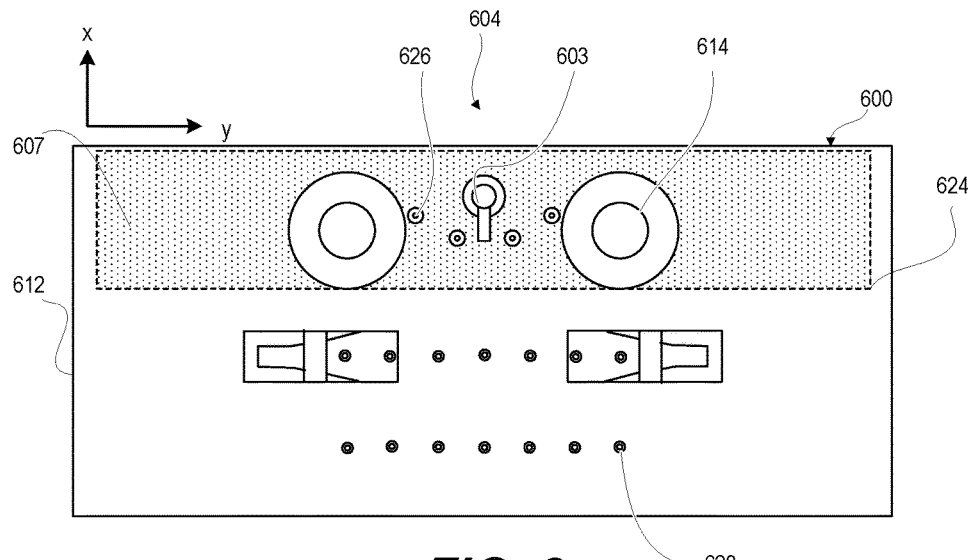
FIG. 8 illustrates a top view of the example UE of FIG. 6, according to one or more embodiments.
Figure 9:
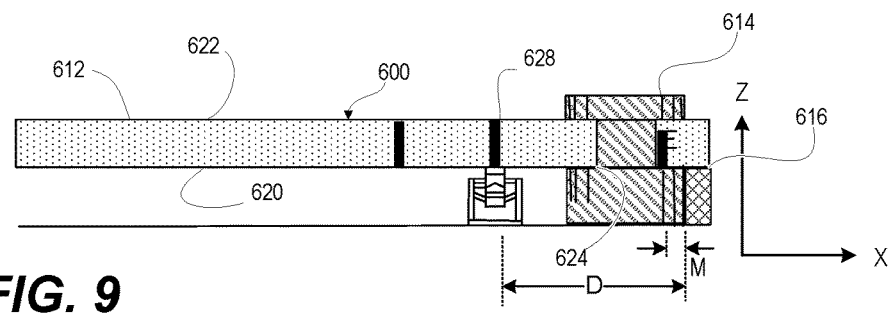
FIG. 9 illustrates a front, cutaway view of the example UE of FIG. 6, according to one or more embodiments.
Figure 10:
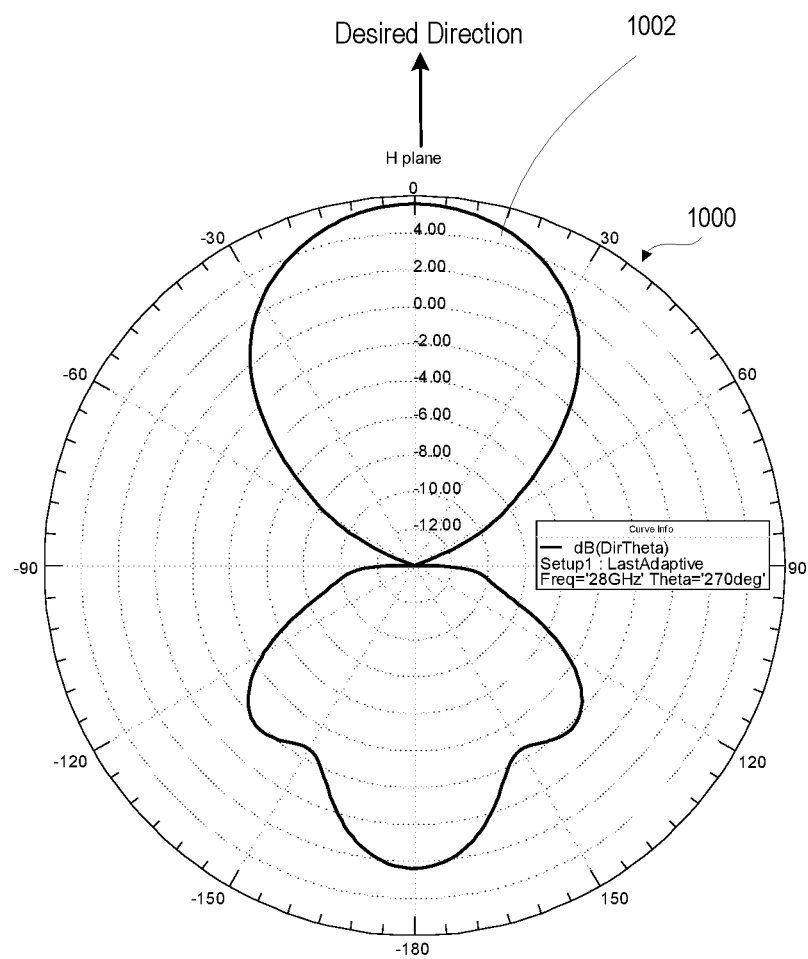
FIG. 10 illustrates a polar plot of a simulated two-dimensional (2D) radiation pattern of the example UE with a common orientation as in FIG. 8, according to one or more embodiments.
Figure 11:
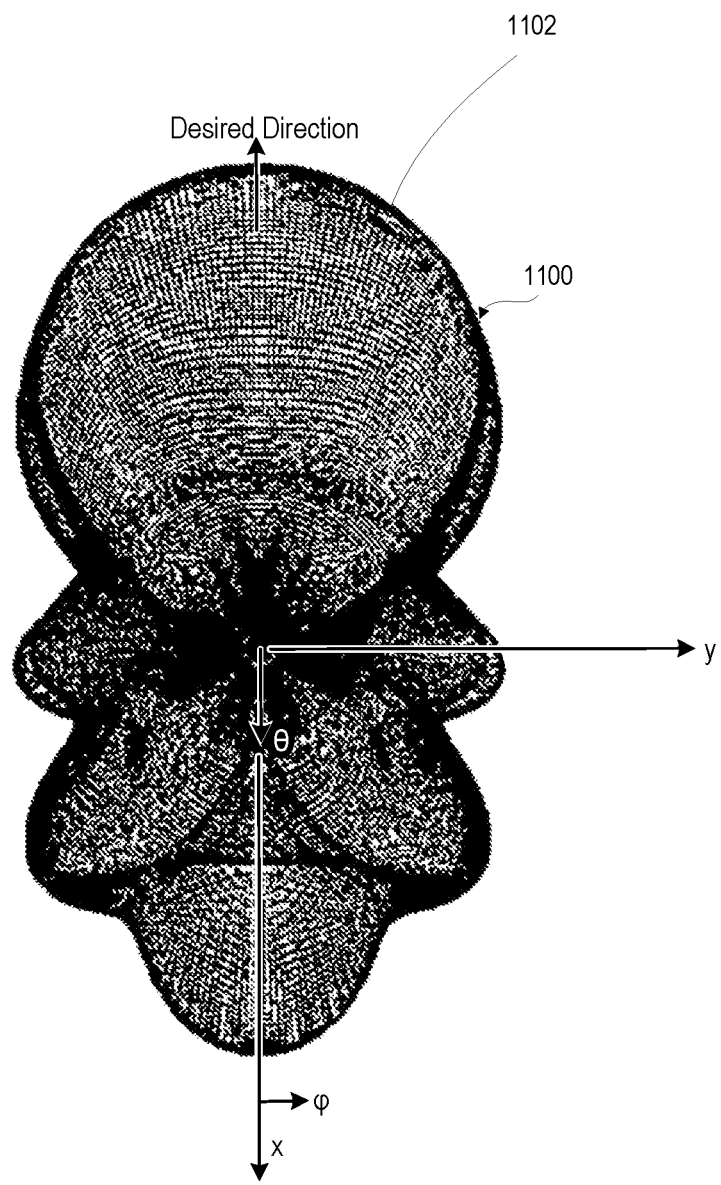
FIG. 11 illustrates a spherical plot of a simulated three-dimensional (3D) radiation pattern of the example UE with a common orientation as in FIG. 8, according to one or more embodiments.
Figure 12:
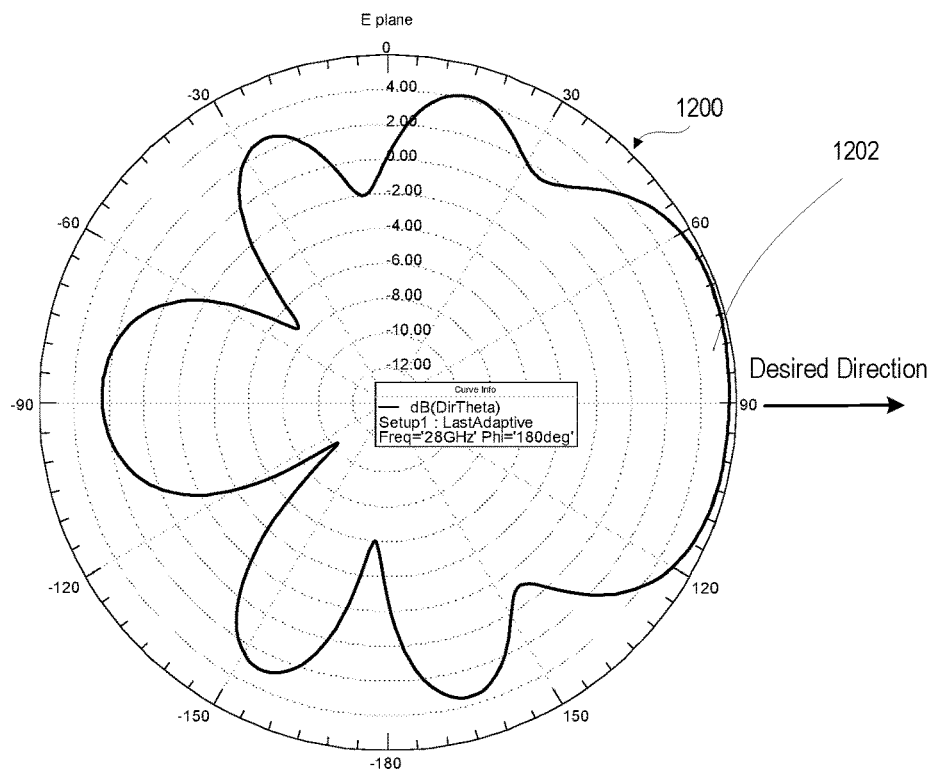
FIG. 12 illustrates a polar plot of a simulated 2D radiation pattern of the example UE with a common orientation as in FIG. 9, according to one or more embodiments.
Figure 13:
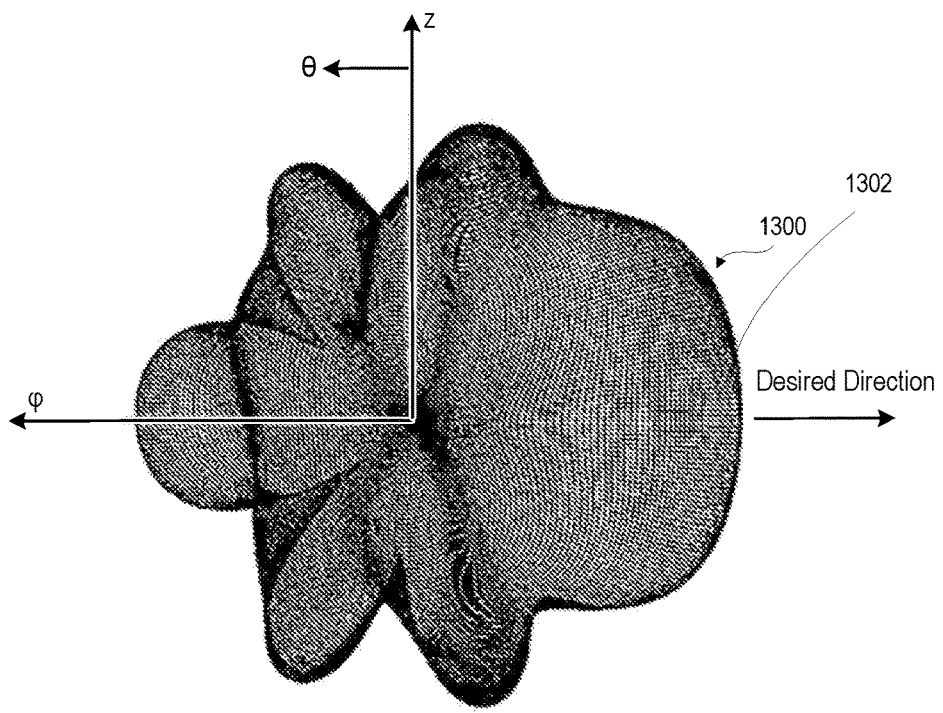
FIG. 13 illustrates a spherical plot of a simulated 3D radiation pattern of the example UE with a common orientation as in FIG. 9, according to one or more embodiments.
Figure 14:
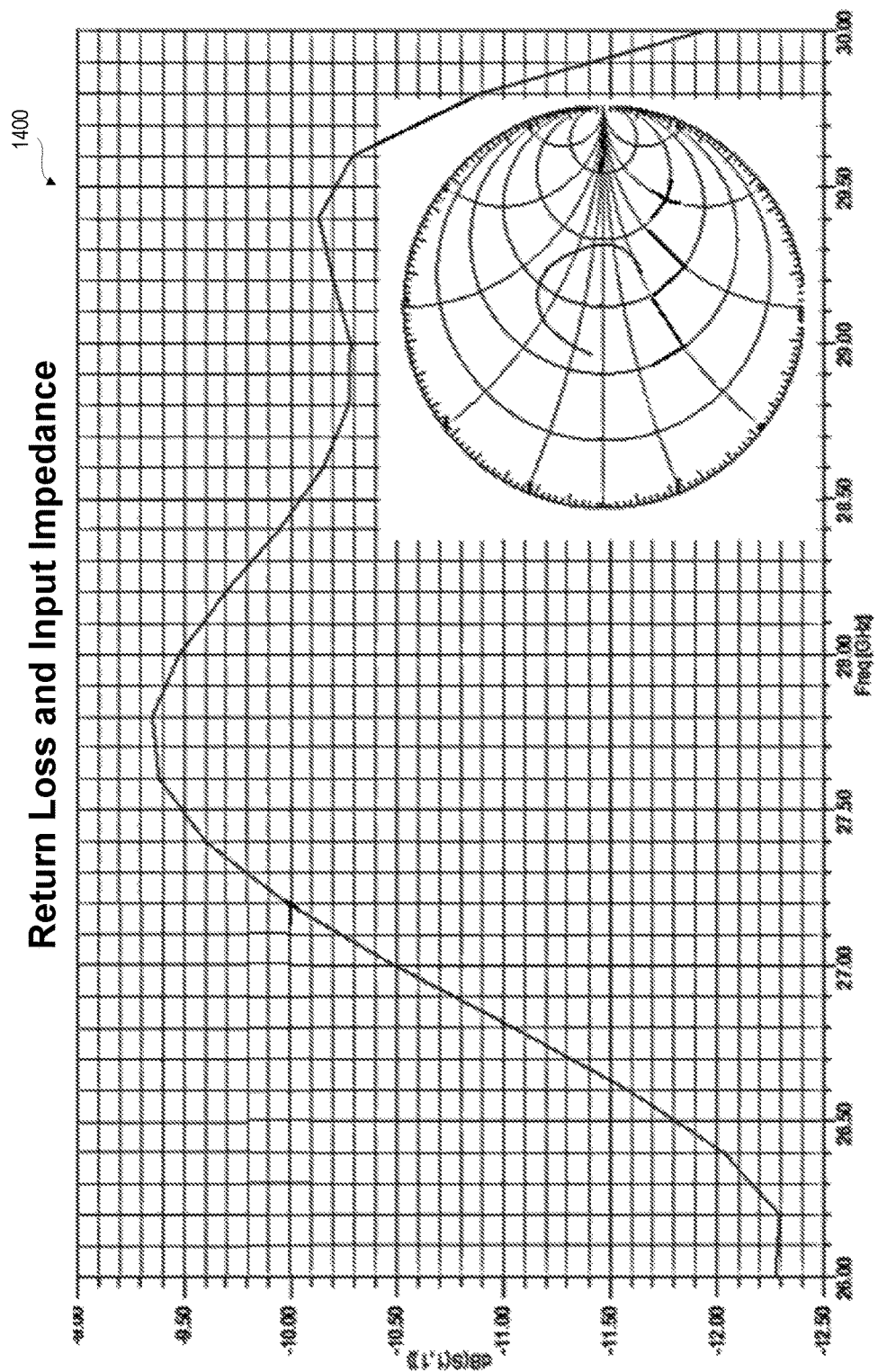
FIG. 14 illustrates a graphical plot of return loss and input impedance of the example UE of FIG. 6, according to one or more embodiments.

For clarity, certain apparatus embodiments are depicted in a certain orthogonal orientation that corresponds to one or more antenna performance plots that have the same orientation. FIG. 10 illustrates a polar plot 1000 of a simulated two-dimensional (2D) radiation pattern of the example UE 600 (FIG. 8). FIG. 11 illustrates a spherical plot 1100 of a simulated three-dimensional (3D) radiation pattern of the example UE 600 (FIG. 8). FIG. 12 illustrates a polar plot 1200 of a simulated 2D radiation pattern of the example UE 600 (FIG. 9). FIG. 13 illustrates a spherical plot 1300 of a simulated 3D radiation pattern of the example UE 600 (FIG. 9). Each of the FIGS. 10-13 include a predominant lobe 1002, 1102, 1202, 1302 respectively in the X-direction that has a greater directivity than a conventional microstrip patch antenna when the beam is scanned at 90 degree off the boresight. FIG. 14 illustrates a graphical plot 1400 of return loss and input impedance of the example UE 600 (FIG. 6). The input impedance supports transmitting and receiving in a bandwidth appropriate for mmWave communications. Antennas are characterized by having an impedance that varies as a function of frequency.

In electromagnetics, directivity is a parameter of an antenna or optical system that measures the degree to which the radiation emitted is concentrated in a single direction. Directivity measures the power density that the antenna radiates in the direction of its strongest emission as compared to the power density radiated by an ideal isotropic radiator that emits uniformly in all directions. The comparison is based on normalized total power. Directivity of an antenna is based on antenna gain and electrical efficiency. Directivity is an important measure because many antennas and optical systems are designed to radiate electromagnetic waves in a single direction or over a narrow angle. Directivity is also defined for an antenna receiving electromagnetic waves. Directivity when receiving is equal to directivity when transmitting. An antenna can include additional elements or surfaces with no electrical connection to the transmitter or receiver, such as parasitic elements and dielectric blocks. These additional elements or surfaces serve to direct the radio waves into a beam or other desired radiation pattern. Passive elements behind the vertical monopole antenna 603 can reduce directivity in a reverse direction (–x). A linear array of vertical monopole antenna 603 constructively resonate along the X-axis for increased directivity.

Figure 15:
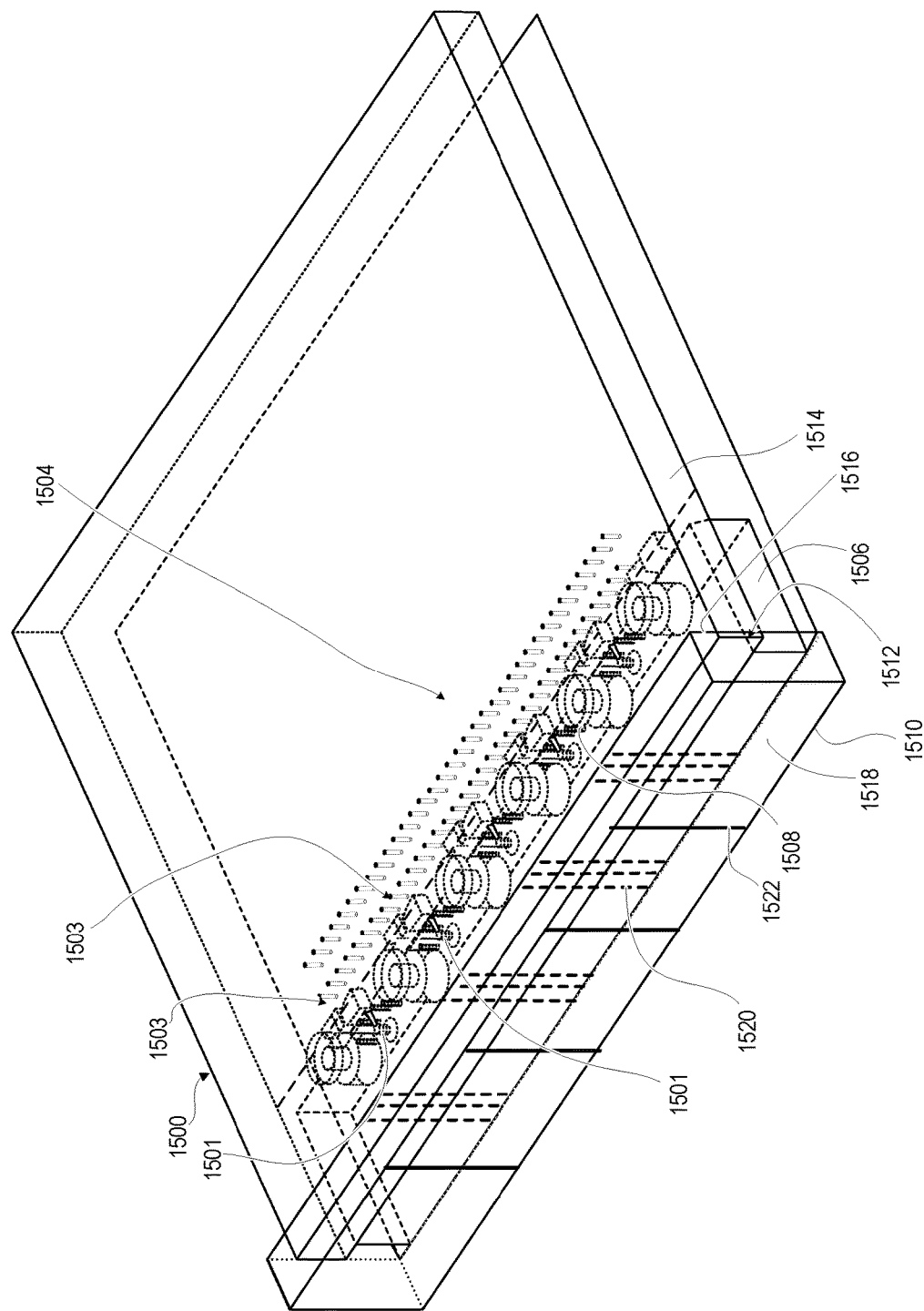
FIG. 15 illustrates an isometric view of an example UE having a serial array of radiating monopoles and a bottom dielectric material block and a lateral side 2 mm thick laser direct structuring (LDS) dielectric material block with parasitic directors, according to one or more embodiments.
Figure 16:
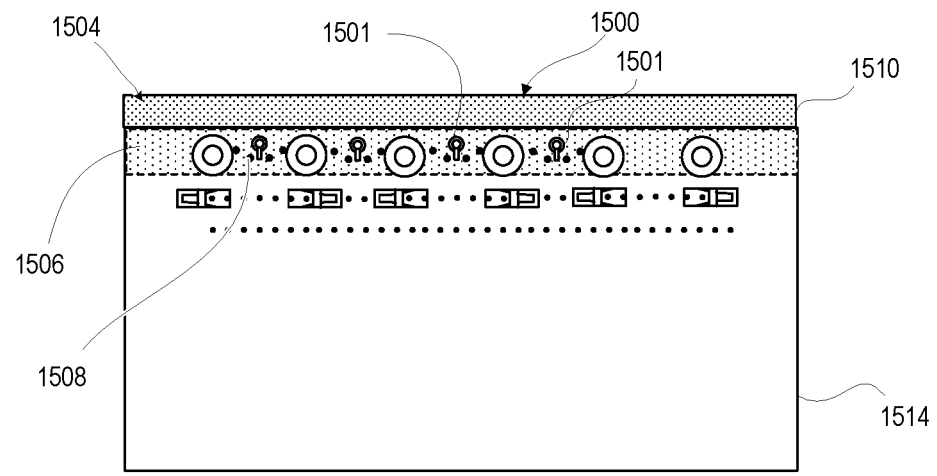
FIG. 16 is a top view of the example UE of FIG. 15, according to one or more embodiments.
Figure 17:
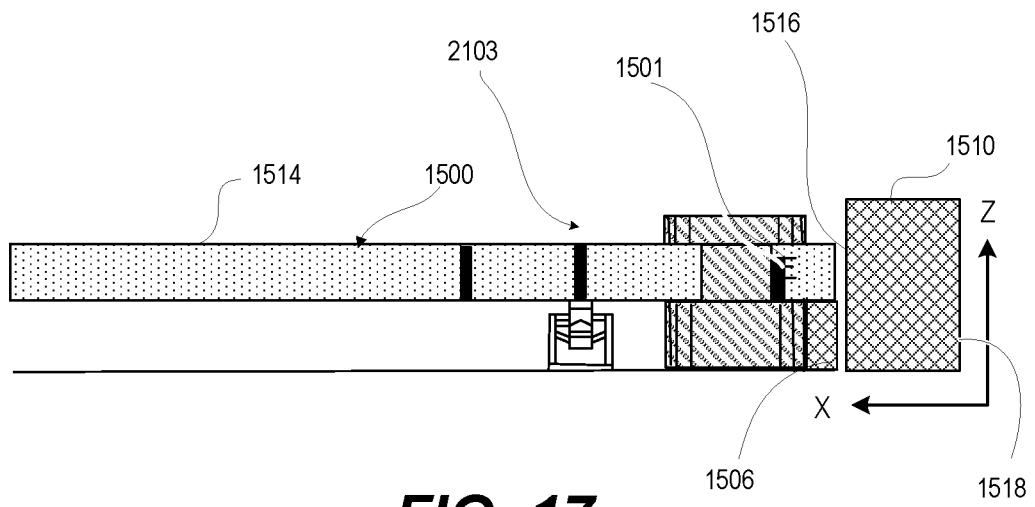
FIG. 17 illustrates a front cutaway view of the example UE of FIG. 15, according to one or more embodiments.
Figure 18:
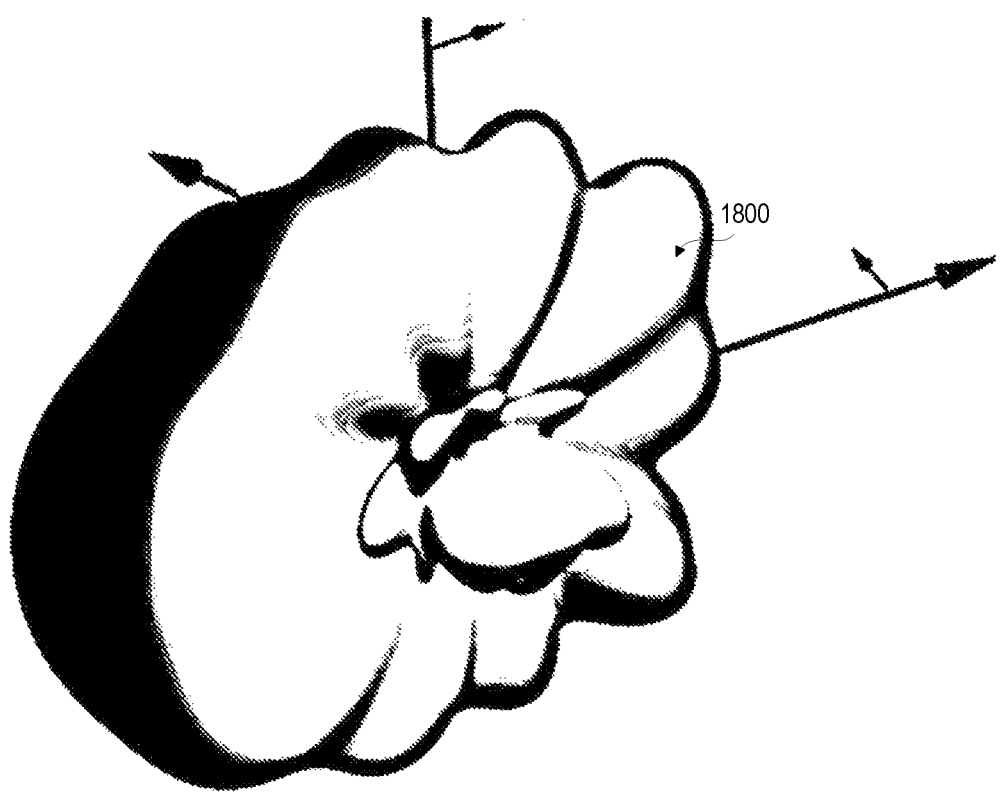
FIG. 18 is a spherical plot of a simulated 3D radiation pattern of the example UE having a common orientation as in FIG. 15, according to one or more embodiments.
Figure 19:
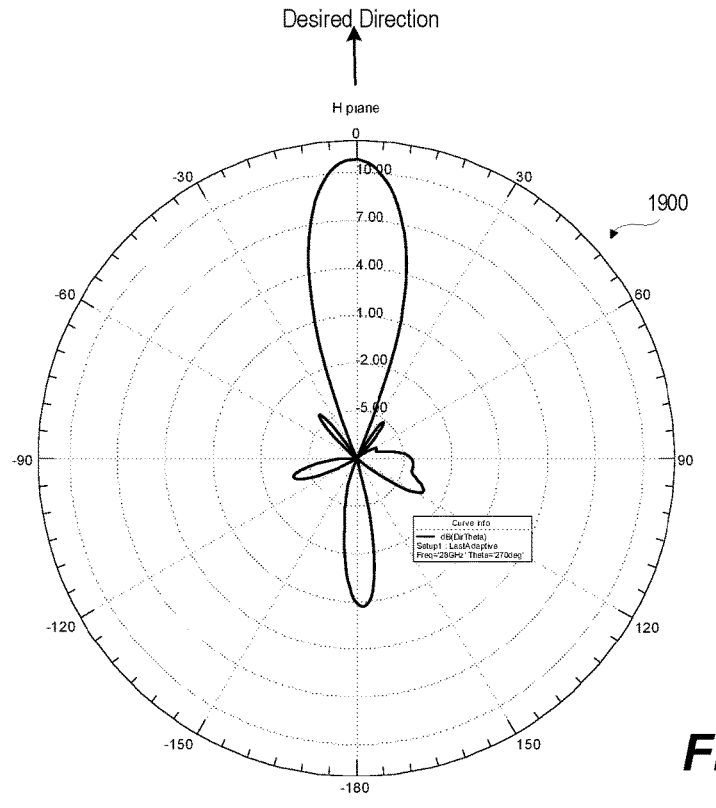
FIG. 19 illustrates a polar plot of a simulated 2D radiation pattern of the example UE having a common orientation as in FIG. 16, according to one or more embodiments.
Figure 20:
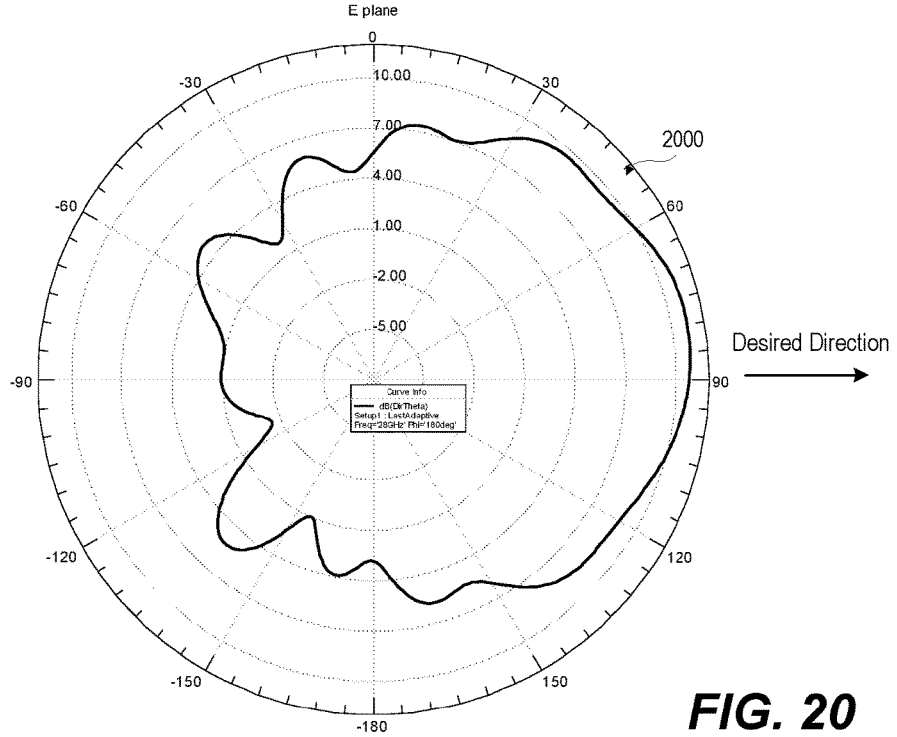
FIG. 20 illustrates a polar plot of a simulated 2D radiation pattern of the example UE having a common orientation as in FIG. 17, according to one or more embodiments.

For clarity, certain apparatus embodiments are depicted in a certain orthogonal orientation that corresponds to one or more antenna performance plots that have the same orientation. FIGS. 15-17 illustrate an example UE 1500 having 4X1 laterally-aligned vertical monopole antennas 1501 of respective radiating monopole arrangements 1503 to form a low-profile mmWave antenna system 1504. In addition to the beam shaping benefits of including a first dielectric material block 1506 below the laterally-aligned vertical monopole antennas 1501 and vertical stubs 1508, UE 1500 includes a second dielectric material block 1510 having 2 mm thickness in the X-direction. The second dielectric material block 1510 is positioned laterally beside a lateral side edge 1512 of a multilayer PCB 1514 that contains the mmWave antenna system 1504. In addition, an outer surface 1516 and an inner surface 1518 of the second dielectric material block 1510 include parasitic directors 1520, 1522 that are aligned respectively with each of the vertical monopole antennas 1501. A more directive antenna beam is shaped by incorporating the second dielectric material block 1510 with parasitic directors 1520 in the UE 1500. FIG. 18 is a spherical plot 1800 of a simulated 3D radiation pattern of the example UE 1500 as oriented in FIG. 15. FIG. 19 illustrates a polar plot 1900 of a simulated 2D radiation pattern of the example UE 1500 as oriented in FIG. 16. FIG. 20 illustrates a polar plot 2000 of a simulated 2D radiation pattern of the example UE 1500 as oriented in FIG. 17. The simulated results of FIGS. 18-20 illustrated further beam shaping with increased directivity in the X-direction with reduced side lobes, especially opposite to the X-direction by introducing the second dielectric material block 1510 (FIG. 15).

Figure 21:
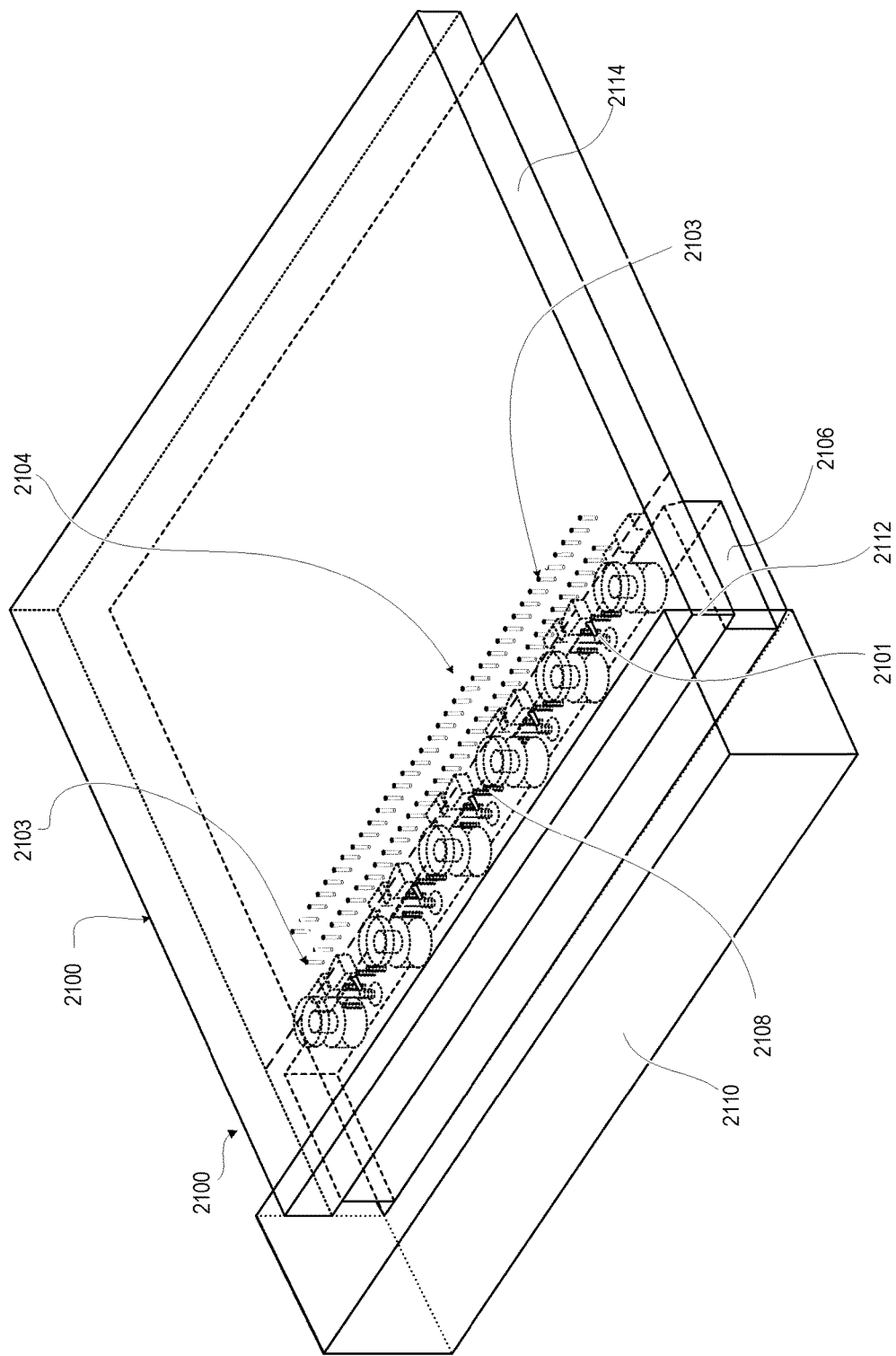
FIG. 21 illustrates an isometric view of an example UE having a serial array of monopole antennas and a bottom dielectric material block and including a 6 mm thick LDS lateral dielectric material block without parasitic directors, according to one or more embodiments.
Figure 22:
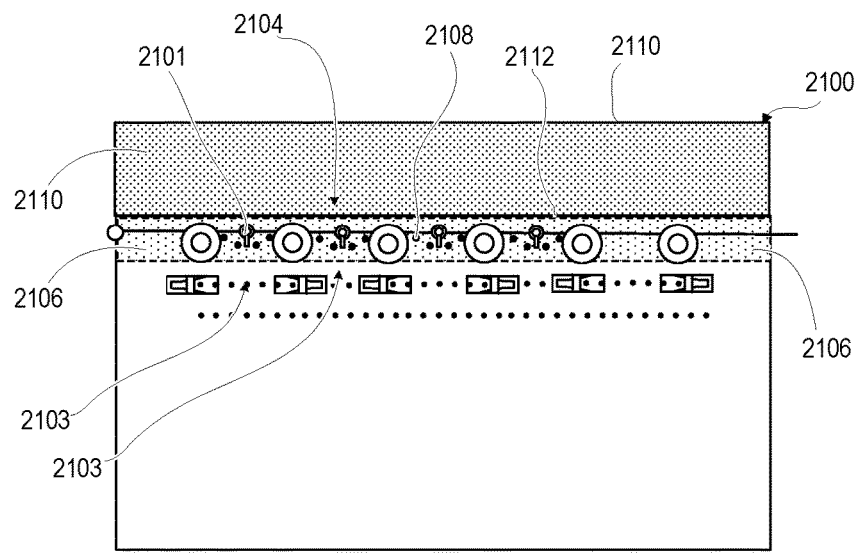
FIG. 22 is a top view of the example UE of FIG. 21, according to one or more embodiments.
Figure 23:
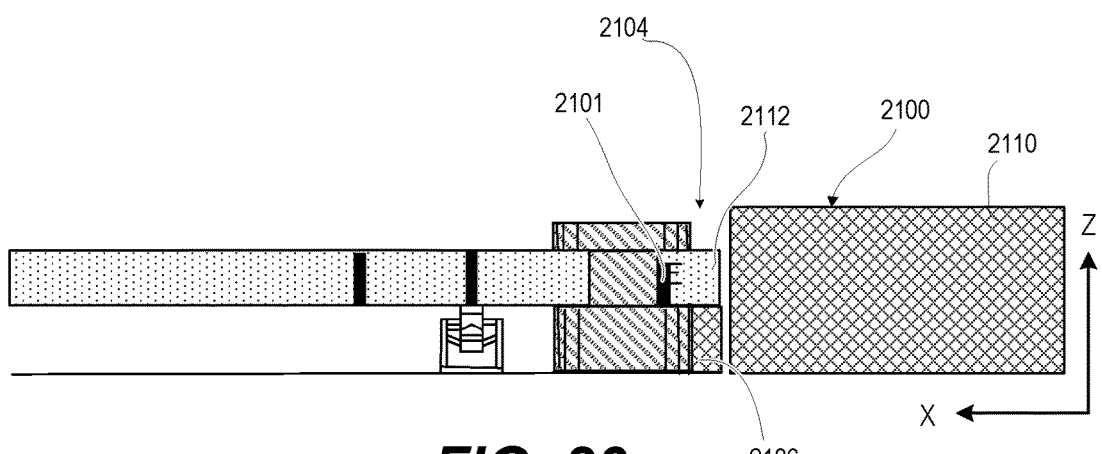
FIG. 23 illustrates a front cutaway view of the example UE of FIG. 21, according to one or more embodiments.

For further comparison, FIGS. 21-23 illustrate an example UE 2100 having 4X1 laterally-aligned vertical monopole antennas 2101 of respective radiating monopole arrangements 2103 to form a low-profile mmWave antenna system 2104. UE 2100 has the beam shaping benefits of a first dielectric material block 2106 below the laterally-aligned vertical monopole antennas 2101 and vertical stubs 2108. In addition, UE 2100 includes a second dielectric material block 2110 having 6 mm thickness in the X-direction. The second dielectric material block 2110 is positioned laterally beside a lateral side edge 2112 of a multilayer PCB 2114 that contains the mmWave antenna system 2104.

Figure 24:
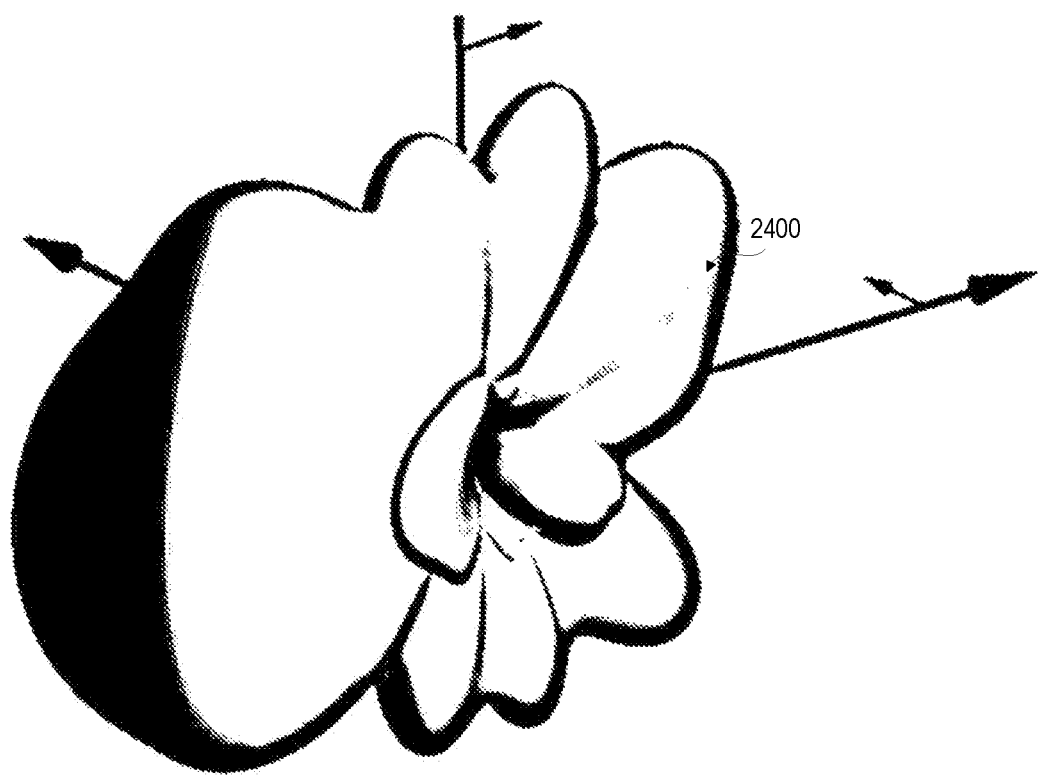
FIG. 24 is a spherical plot of a simulated 3D radiation pattern of the example UE having the orientation of FIG. 21 with the peak of the radiation pattern is towards the lateral dielectric material block, according to one or more embodiments.
Figure 25:
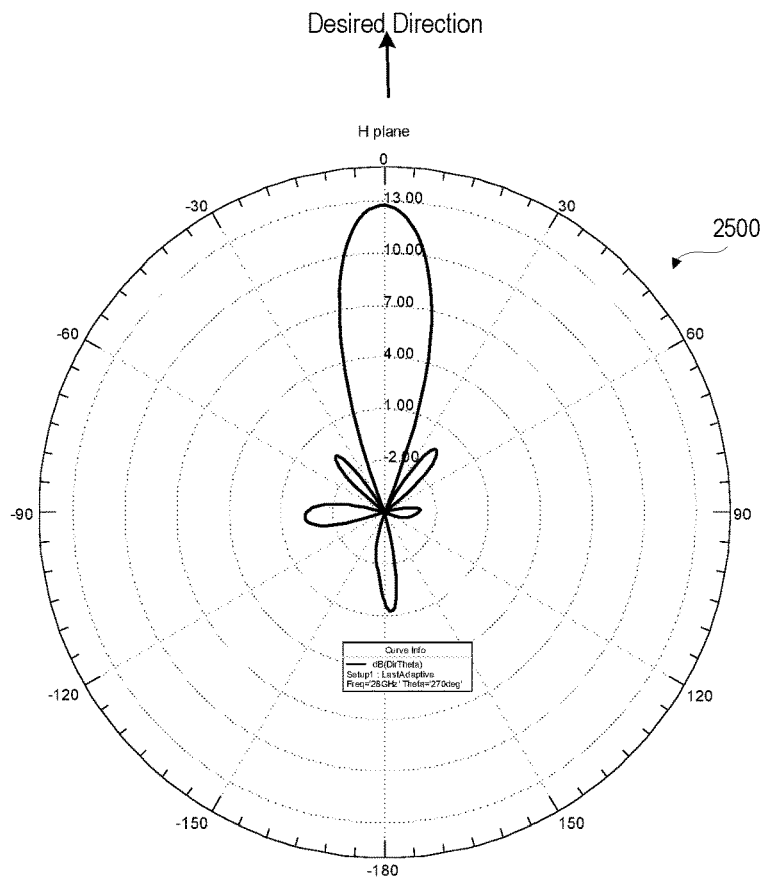
FIG. 25 illustrates a polar plot of a simulated 2D radiation pattern of the example UE having the orientation of FIG. 22, according to one or more embodiments.
Figure 26:
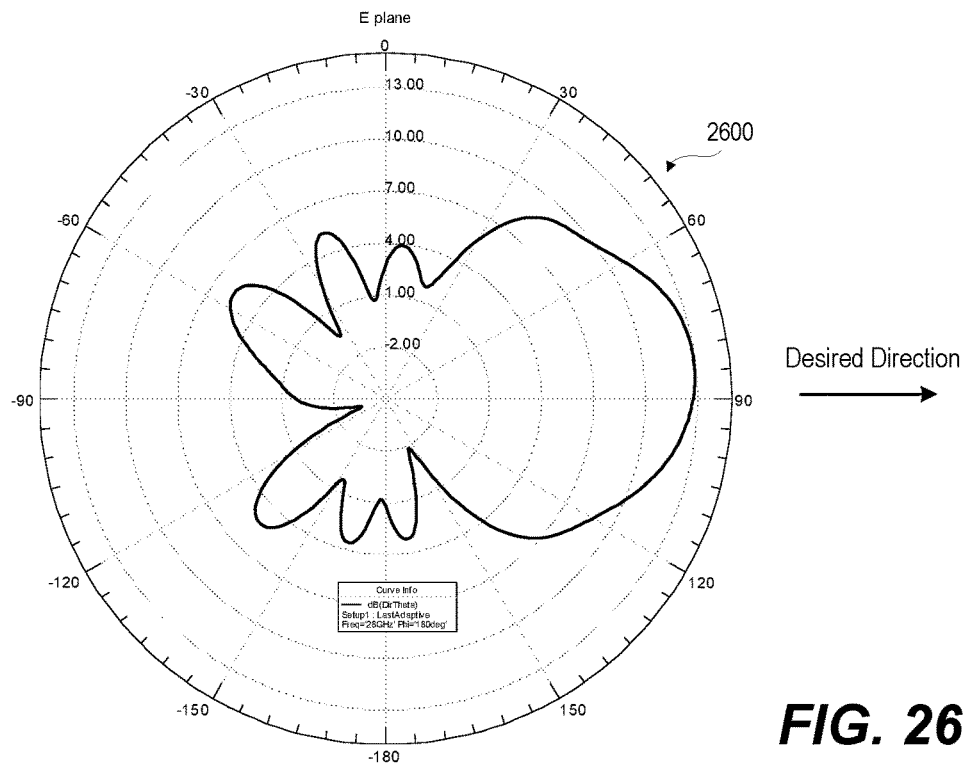
FIG. 26 illustrates a polar plot of a simulated 2D radiation pattern of the example UE having the orientation of FIG. 23, according to one or more embodiments.

FIG. 24 is a spherical plot 2400 of a simulated 3D radiation pattern of the example UE 2100 oriented as in FIG. 21. FIG. 25 illustrates a polar plot 2500 of a simulated 2D radiation pattern of the example UE 2100 as oriented in FIG. 22. FIG. 26 illustrates a polar plot 2600 of a simulated 2D radiation pattern of the example UE 2100 as oriented in FIG. 23. The thicker lateral dielectric block 2110 provides more directivity in the X-direction by narrowing the lobe in the orthogonal X-Z plane than the previously simulated radiation pattern for a 2 mm lateral dielectric block of FIGS. 15-20.

Figure 27:
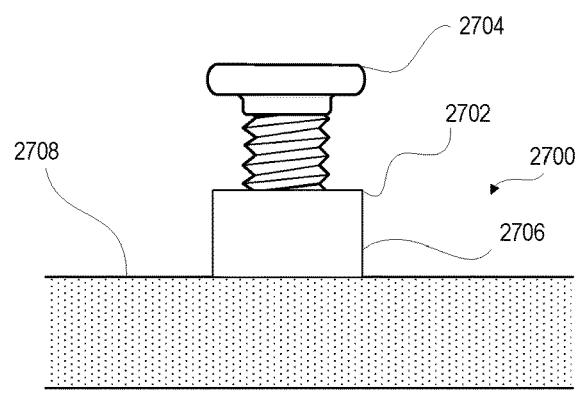
FIG. 27 illustrates a detail view of a screw boss, according to one or more embodiments.
Figure 28:
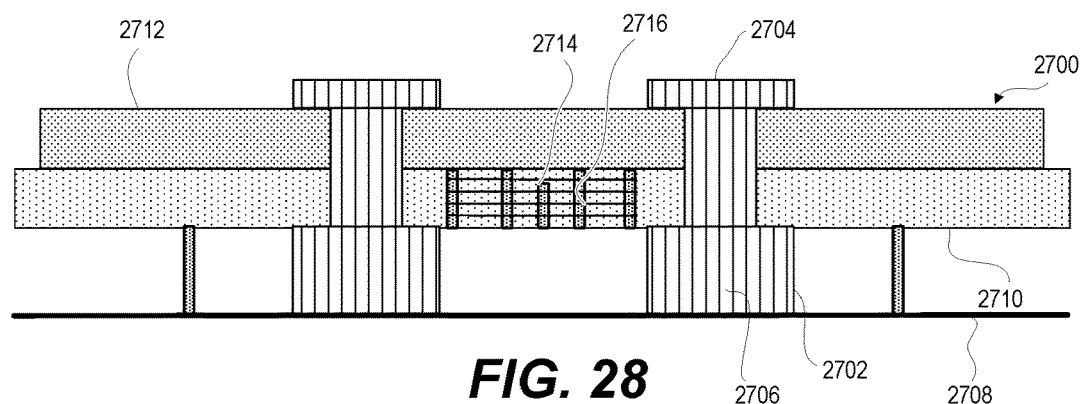
FIG. 28 illustrates a lateral side view of an example UE having screw bosses attaching the multilayer PCB to a device chassis, according to one or more embodiments.

FIG. 27 illustrates, within a UE 2700, a screw boss 2702 having a screw 2704 removably positioned within a metal cylinder 2706, which is attached to a device chassis 2708. FIG. 28 illustrates the screw boss 2702 mechanically holding a PCB 2710 in position within a UE 2700. In one or more embodiments, an mmWave monopole radiating system in accordance with the present disclosure may operate at mm wave frequencies between about 10 GHz to about 110 GHz. A length L of the screw 2704 should be about 0.33λ, or larger (L≥0.33λ), where λ, is the wavelength of the lowest frequency to be transmitted or received.

Figure 29:
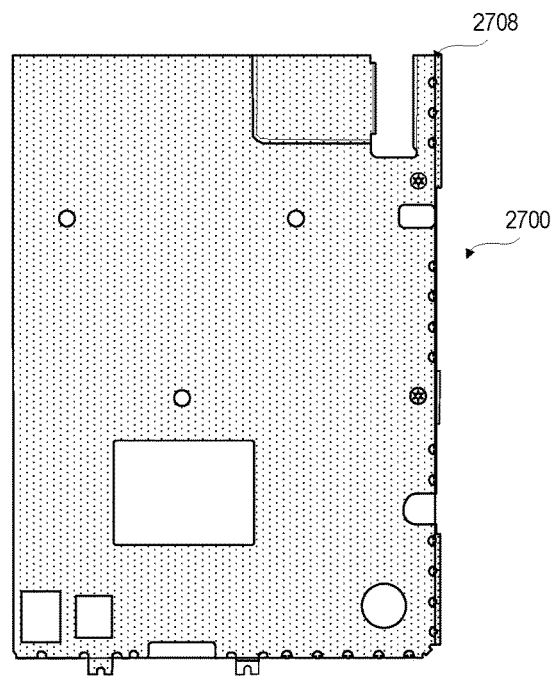
FIG. 29 illustrates a top view of the device chassis of the example UE of FIG. 27, according to one or more embodiments.

FIGS. 27-29 illustrate the device chassis 2708 that may operate as an electrical ground for the circuitry such as PCB 2710 of the UE 2700. FIG. 28 illustrates a dielectric block 2712 secured in place on the device chassis 2708 by the screw bosses 2702. Vertical monopole antenna 2714 and vertical stubs 2716 may each be comprised of vertically stacked vias within the layers of the PCB 2710. The screw bosses 2702 operate as both part of the mmWave antenna structure and part of the mechanical mechanism that holds the PCB 2710 in place and attached to the device chassis 2708 within the UE 2700.

Figure 30:
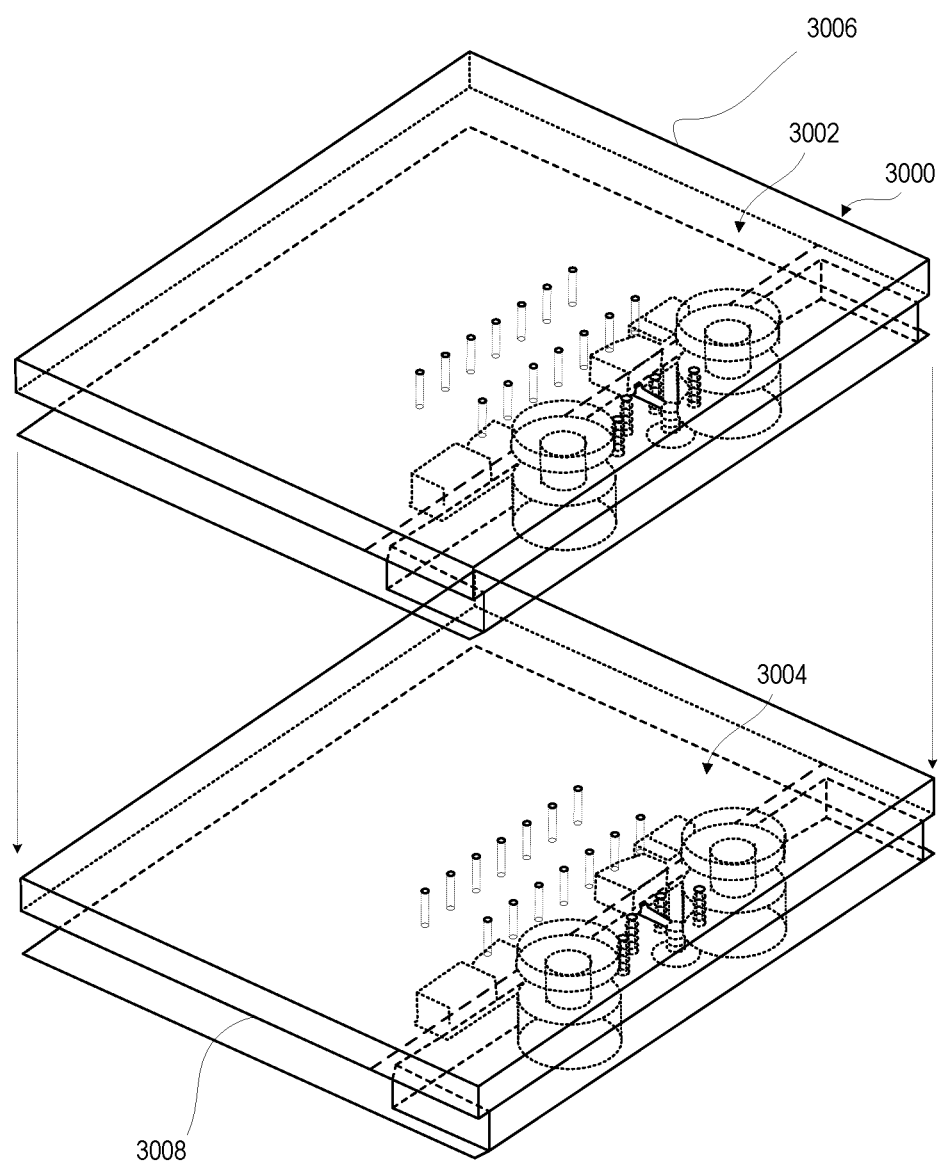
FIG. 30 illustrates an isometric, exploded view of an example UE having additional antenna gain that is achieved by vertically stacking radiating monopole arrangements, according to one or more embodiments.

FIG. 30 illustrate a UE 3000 having additional antenna gain that is achieved by vertically stacking radiating monopole arrangements 3002, 3004 of mmWave antennas 3006, 3008, according to one or more embodiments. For clarity, radiating monopole arrangements 3002, 3004 each include a single vertical monopole antenna 3006, 3008, respectively. In other embodiments, a radiating monopole arrangement can include two or more vertical monopole antennas.

Figure 31A:
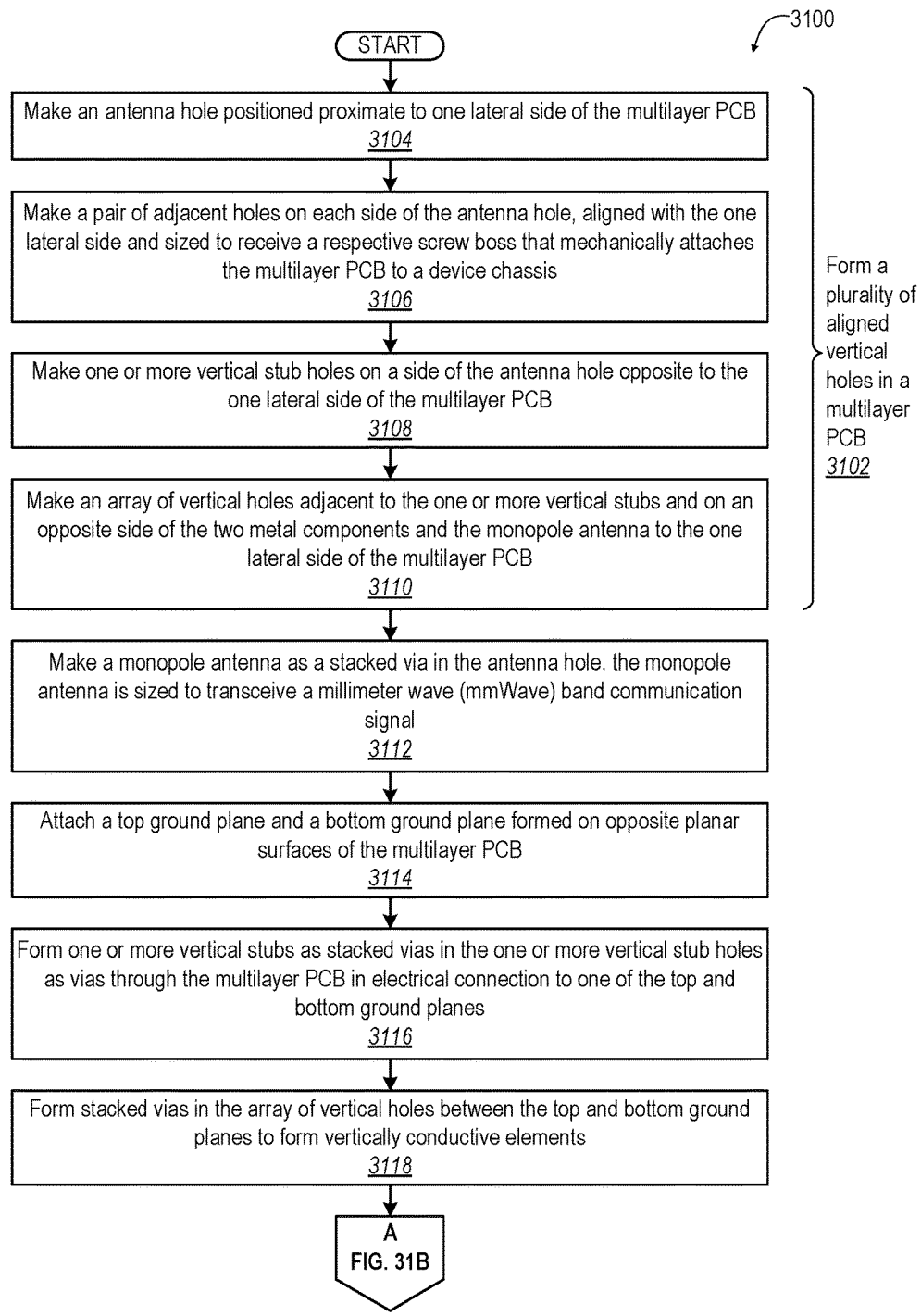

FIGS. 31A-31B illustrate a method 3100 of forming low-profile mmWave antennas into a multilayer PCB. Portions of the low-profile mmWave antennas also serve as integrated mechanical loading for mounting in an electronic device such as a UE. The mmWave antennas have higher antenna directivity toward a lateral side of the multilayer PCB. In one or more embodiments, the method 3100 includes making a plurality of aligned vertical holes in a multilayer PCB (block 3102). Each layer has a planar surface defining a horizontal plane. In one or more embodiments, the method 3100 includes making an antenna hole positioned proximate to one lateral side of the multilayer PCB (block 3104). The method 3100 includes making a pair of adjacent holes on each side of the antenna hole, aligned with the one lateral side and sized to receive a respective screw boss that mechanically attach the multilayer PCB to a device chassis (block 3106). The method 3100 includes making one or more vertical stub holes on a side of the antenna hole opposite to the one lateral side of the multilayer PCB (block 3108). Method 3100 includes making an array of vertical holes adjacent to the one or more vertical stubs and on an opposite side of the two metal components and the monopole antenna to the one lateral side of the multilayer PCB (block 3110).

The method 3100 includes manufacturing a monopole antenna as a stacked via in the antenna hole, with the monopole antenna being sized to propagate a millimeter wave (mmWave) band communication signal (block 3112). The method 3100 includes attaching a top ground plane and a bottom ground plane formed on opposite planar surfaces of the multilayer PCB (block 3114). Method 3100 includes forming one or more vertical stubs as stacked vias in the one or more vertical stub holes through the multilayer PCB, the vias being in electrical connection to one of the top and bottom ground planes (block 3116). Method 3100 includes forming stacked vias in the array of vertical holes between the top and bottom ground planes to form vertically conductive elements (block 3118).

Method 3100 includes attaching a transceiver integrated circuit on one side of the multilayer PCB, proximate to the monopole antenna and electrically connected to the monopole antenna (block 3120). Method 3100 includes adding one or more vertical parasitic antenna elements on a selected at least one of an inner surface and an outer surface of a second dielectric material that when installed on the multilayer PCB is aligned with the monopole antenna to increase directivity of the antenna assembly (block 3122).

Method 3100 includes attaching a first dielectric material on another side of the multilayer PCB proximate to the monopole antenna and opposite to the transceiver integrated circuit (block 3124). Method 3100 includes attaching a second dielectric material to the one side of the multilayer PCB proximate to the monopole antenna and in the directivity direction (block 3126). Method 3100 includes attaching the multilayer PCB to a device chassis of an electronic device with screw bosses in the pair of adjacent holes (block 3128). Then method 3100 ends. The vertical stubs, vertically conductive elements, parasitic antenna elements, first and second dielectric materials, and the screw bosses attaching the multilayer PCB to a device chassis all shape the beam directivity of the monopole antenna toward the one lateral side of the multilayer PCB.

In the above described flow charts of FIGS. 31A-31B, one or more of the methods may be embodied in an automated manufacturing system that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is designated only by the appended claims.

In the above flow chart presented herein, certain steps of the methods can be combined, performed simultaneously or in a different order, or perhaps omitted, without deviating from the spirit and scope of the described innovation. While the method steps are described and illustrated in a particular sequence, use of a specific sequence of steps is not meant to imply any limitations on the innovation. Changes may be made with regards to the sequence of steps without departing from the spirit or scope of the present innovation. Use of a particular sequence is therefore, not to be taken in a limiting sense, and the scope of the present innovation is defined only by the appended claims.

As will be appreciated by one skilled in the art, embodiments of the present innovation may be embodied as a system, device, and/or method. Accordingly, embodiments of the present innovation may take the form of an entirely hardware embodiment or an embodiment combining software and hardware embodiments that may all generally be referred to herein as a "circuit," "module" or "system."

Aspects of the present innovation are described below with reference to flowchart illustrations and/or block diagrams of methods, apparatus (systems) and computer program products according to embodiments of the innovation. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

While the innovation has been described with reference to exemplary embodiments, it will be understood by those skilled in the art that various changes may be made and equivalents may be substituted for elements thereof without departing from the scope of the innovation. In addition, many modifications may be made to adapt a particular system, device or component thereof to the teachings of the innovation without departing from the essential scope thereof. Therefore, it is intended that the innovation not be limited to the particular embodiments disclosed for carrying out this innovation, but that the innovation will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the innovation. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present innovation has been presented for purposes of illustration and description, but is not intended to be exhaustive or limited to the innovation in the form disclosed. Many modifications and variations will be apparent to those of ordinary skill in the art without departing from the scope and spirit of the innovation. The embodiment was chosen and described in order to best explain the principles of the innovation and the practical application, and to enable others of ordinary skill in the art to understand the innovation for various embodiments with various modifications as are suited to the particular use contemplated.

What is claimed is:

1. An electronic device comprising:
   a computing environment comprising active components attached to and functionally interconnected on more than one layer of a multilayer printed circuit board (PCB), where a planar surface of each layer of the multilayer PCB defines a horizontal plane;
   a communication module in communication with the active components of the computing environment, the communication module transceiving in a millimeter wave (mmWave) band via an input/output component;
   at least one ground plane formed on at least a portion of a planar surface of the multilayer PCB, the input/output component comprising a conductive component attached to the multilayer PCB;
   two or more metal components that are physically attached to the multilayer PCB and electrically coupled to the at least one ground plane;
   a monopole antenna electrically connected to the input/output component, positioned vertically through one or more layers of the multilayer PCB, positioned proximate to one lateral side of the multilayer PCB, and aligned between two adjacent ones of the two or more metal components; and
   one or more vertical stubs formed through the multilayer PCB, vertically aligned with the monopole antenna, and spaced to a side of the monopole antenna opposite to the one lateral side of the multilayer PCB, each vertical stub electrically grounded to the ground plane;
   wherein the two adjacent ones of the two or more metal components and the one or more vertical stubs shape beam directivity of the monopole antenna toward the one lateral side of the multilayer PCB.

2. The electronic device of claim 1, further comprising a first dielectric material positioned on at least a portion of one planar side of the multilayer PCB, vertically aligned and proximate to the monopole antenna.

3. The electronic device of claim 2, wherein the communication module comprises a transceiver circuit mounted on another planar side of the multilayer PCB, opposite to the first dielectric material, and comprising a transceiver connection connected to a first end of the monopole antenna.

4. The electronic device of claim 3, further comprising a second dielectric material positioned adjacent to the one lateral side of the multilayer PCB.

5. The electronic device of claim 4, wherein the mmWave antenna configuration further comprises one or more vertical parasitic antenna elements on a selected at least one of: an inner surface and an outer surface of the second dielectric material, and aligned with the monopole antenna to increase directivity.

6. The electronic device of claim 1, further comprising more than one aligned mmWave antenna assembly to increase antenna gain along the directivity direction.

7. The electronic device of claim 6, wherein the more than one aligned mmWave antenna assembly comprise laterally aligned mmWave antenna assemblies formed in the multilayer PCB.

8. The electronic device of claim 6, wherein the more than one aligned mmWave antenna assembly comprise a second multilayer PCB stacked on the multilayer PCB and having a second mmWave antenna assembly that is vertically aligned with the mmWave antenna assembly of the multilayer PCB.

9. The electronic device of claim 1, wherein the one or more vertical stubs are horizontally spaced a distance selected from a range of 0.1 to 0.5 of a wavelength (k) from the monopole antenna, wherein wavelength (k) is a wavelength of the lowest mmWave frequency that the mmWave antenna is intended to transmit or receive.

10. The electronic device of claim 1, wherein the at least one ground plane comprises a top ground plane and a bottom ground plane formed on opposite planar surfaces of the multilayer PCB, the electronic device comprises an array of vertical conductive elements electrically connected between the top and bottom ground planes adjacent to the one or more vertical stubs on an opposite side of the two metal components and the monopole antenna to the one lateral side of the multilayer PCB.

11. The electronic device of claim 10, wherein each of the array of vertically conductive elements and the monopole antenna comprise stacked vias formed in the multilayer PCB.

12. The electronic device of claim 1, further comprising a device chassis encompassing the multilayer PCB, wherein the two or more metal members comprise screw bosses that mechanically attach the multilayer PCB to the device chassis.

13. The electronic device of claim 1, further comprising a second mmWave antenna assembly positioned in a selected one of an orthogonal alignment and an opposite alignment to the mmWave antenna assembly to provide a secondary directivity direction.

14. An antenna assembly comprising:
a multilayer printed circuit board (PCB), where a planar surface of each layer of the multilayer PCB defines a horizontal plane;
an input/output component attached to a selected planar surface of the PCB and connectable to a communication module for propagating a signal in a millimeter wave (mmWave) band;
at least one ground plane formed on at least a portion of a planar surface of the multilayer PCB, the input/output component comprising a conductive component attached to the multilayer PCB;
two or more metal components that are physically attached to the multilayer PCB and electrically coupled to the at least one ground plane;
a monopole antenna electrically connected to the input/output component, positioned vertically through one or more layers of the multilayer PCB, positioned proximate to one lateral side of the multilayer PCB, and aligned between two adjacent ones of the two or more metal components; and
one or more vertical stubs formed through the multilayer PCB, vertically aligned with the monopole antenna, and spaced to a side of the monopole antenna opposite to the one lateral side of the multilayer PCB, each vertical stub electrically grounded to the ground plane,
wherein the two adjacent ones of the two or more metal components and the one or more vertical stubs shape beam directivity of the monopole antenna toward the one lateral side of the multilayer PCB.

15. The antenna assembly of claim 14, further comprising a selected at least one of:
a first dielectric material positioned on at least a portion of one planar side of the multilayer PCB, vertically aligned and proximate to the monopole antenna; and
a second dielectric material positioned adjacent to the one lateral side of the multilayer PCB,
wherein the second dielectric material comprises one or more vertical parasitic antenna elements on a selected at least one of: an inner surface and an outer surface and aligned with the monopole antenna to increase directivity of the antenna assembly.

16. The antenna assembly of claim 14, further comprising at least one addition mmWave antenna assembly oriented in a selected one of lateral and vertical alignment to the mmWave antenna assembly to increase antenna gain along the directivity direction and an orthogonal alignment to add a second orthogonal directivity direction.

17. The antenna assembly of claim 14, wherein:
the one or more vertical stubs are horizontally spaced a distance selected from a range of 0.1 to 0.5 of a wavelength ($\lambda$) from the monopole antenna, wherein wavelength ($\lambda$) is a wavelength of the lowest mmWave frequency that the mmWave antenna is intended to transmit or receive;
the at least one ground plane comprises a top ground plane and a bottom ground plane formed on opposite planar surfaces of the multilayer PCB, the electronic device comprises an array of vertical conductive elements electrically connected between the top and bottom ground planes adjacent to the one or more vertical stubs on an opposite side of the two metal components and the monopole antenna to the one lateral side of the multilayer PCB;
each of the array of vertically conductive elements and the monopole antenna comprise stacked vias formed in the multilayer PCB; and
the two or more metal members comprise screw bosses that mechanically attach the multilayer PCB to a device chassis of an electronic device.

18. A method comprising:
making a plurality of aligned vertical holes in a multilayer printed circuit board (PCB) having more than one layer, each layer having a planar surface defining a horizontal plane, wherein the plurality of aligned vertical holes comprise:
an antenna hole positioned proximate to one lateral side of the multilayer PCB;
a pair of adjacent holes on each side of the antenna hole, aligned with the one lateral side and sized to receive a respective screw boss that mechanically attaches the multilayer PCB to a device chassis; and
one or more vertical stub holes on a side of the antenna hole opposite to the one lateral side of the multilayer PCB;
making a monopole antenna as a stacked via in the antenna hole, the monopole antenna sized to propagate a millimeter wave (mmWave) band communication signal;
attaching at least one ground plane on one planar surface of the multilayer PCB; and
forming one or more vertical stubs as stacked vias in the one or more vertical stub holes through the multilayer PCB in electrical connection to the at least one ground plane,
wherein the vertical stubs and the screw bosses attaching the multilayer PCB to a device chassis shape beam directivity of the monopole antenna toward the one lateral side of the multilayer PCB.

19. The method of claim 18, further comprising:
attaching a transceiver integrated circuit on one side of the multilayer PCB proximate to the monopole antenna and electrically connected to the monopole antenna;
attaching a first dielectric material on another side of the multilayer PCB proximate to the monopole antenna;
attaching a second dielectric material to the one lateral side of the multilayer PCB proximate to the monopole antenna and in the directivity direction; and
attaching the multilayer PCB to a device chassis of an electronic device with screw bosses in the pair of adjacent holes.

20. The method of claim 18, wherein:
attaching the at least one ground plane on one planar surface comprises attaching a top ground plane and a bottom ground plane formed on opposite planar surfaces of the multilayer PCB;

making the plurality of aligned vertical holes further comprises making an array of vertical holes between the top and bottom ground planes adjacent to the one or more vertical stubs and on an opposite side of the two metal components and the monopole antenna to the one lateral side of the multilayer PCB; and forming stacked vias in the array of vertical holes between the top and bottom ground planes to form vertically conductive elements to further shape beam directivity toward the one lateral side of the multilayer PCB.

* * * * *